United States Patent [19]
Jenkins et al.

[11] Patent Number: 5,285,308
[45] Date of Patent: Feb. 8, 1994

[54] SPATIAL LIGHT MODULATORS FOR INCOHERENT/COHERENT MULTIPLEXED HOLOGRAPHIC RECORDING AND READOUT

[75] Inventors: B. Keith Jenkins, Long Beach; Armand R. Tanguay, Jr., Fullerton, both of Calif.

[73] Assignee: University of Southern California, Calif.

[21] Appl. No.: 835,218

[22] Filed: Feb. 13, 1992

Related U.S. Application Data

[62] Division of Ser. No. 505,790, Apr. 6, 1990, Pat. No. 5,121,231.

[51] Int. Cl.$^5$ .......................... G02F 1/01; G02F 1/03; G03H 1/12
[52] U.S. Cl. ..................................... 359/260; 359/276; 359/263; 359/261; 359/245; 359/11; 365/216
[58] Field of Search .................... 359/10, 11, 245, 320, 359/261, 263, 260, 259, 276, 277, 316, 317, 318; 365/216, 234

[56] References Cited

U.S. PATENT DOCUMENTS

3,518,634 6/1970 Ballman et al. ..................... 359/245

OTHER PUBLICATIONS

S. H. Lee, et al, "Two-dimensional silicon/PLZT spatial light modulators: design considerations and technology", *Optical Engineering*, vol. 25, No. 2, pp. 250-260 (Feb. 1986).

C. Warde et al, "Spatial Light Modulators: Applications and Functional Capabilities", Chapter 7.2 in *Optical Signal Processing*, J. Homer, Ed., Academic Press, New York, (1987), pp. 477-523.

D. A. B. Miller, "Quantum wells for optical information processing", *Optical Engineering*, vol. 26, No. 5, pp. 368-372 (May, 1987).

P. Wheatley et al, "Three-terminal noninverting optoelectronic logic device", *Optics Letters*, vol. 12, No. 10, pp. 784-786 (Oct. 1987).

G. Livescu et al, "Spatial light modulator and optical dynamic memory using a 6×6 array of self-electro-optic-effect devices", *Optics Letters*, vol. 13, No. 4, pp. 297-299 (Apr. 1988).

T.-Y. Hsu, et al, "Multiple quantum well spatial light modulators for optical processing applications", *Optical Engineering*, vol. 27, No. 5, pp. 372-384 (May 1988).

F. Kiamilev et al, "Programmable optoelectronic multiprocessors and their comparison with symbolic substitution for digital optical computing", *Optical Engineering*, vol. 28, No. 4, pp. 396-409 (Apr. 1989).

R. H. Yan et al, "Electroabsorptive Fabry-Perot Reflection Modulators with Asymmetric Mirrors", *IEEE Photonics Technology Letters*, vol. 1, No. 9, pp. 273-275 (Sep. 1989).

(List continued on next page.)

*Primary Examiner*—Bruce Y. Arnold
*Assistant Examiner*—Evelyn A. Lester
*Attorney, Agent, or Firm*—Benman & Collins

[57] ABSTRACT

The present invention relates to a novel spatial light modulator comprising a plurality of individual pixels that each contain separate detectors, electronic circuitry, and optical modulators. A primary application of such a spatial light modulator is to provide the requisite nonlinear relationship between a plurality of optical beams fanned in to each detector on the one hand, and a plurality of optical beams fanned out from such modulator on the other, on a pixel-by-pixel basis. In one embodiment, the spatial light modulator is configured to differentially amplify the inputs to two separate detectors within each pixel, and to transform in a sigmoidal manner the output signals applied to two separate optical modulators located within the same pixel. In a second embodiment, two juxtaposed optical modulators are used within each pixel to independently control the amplitude and phase of the output beam(s). In a third embodiment, the electronic circuitry within each pixel is designed to phase modulate the output beam(s) in such a manner as to provide mutual incoherence among the individually coherent output beams from the set of pixels that comprise the array.

36 Claims, 25 Drawing Sheets

OTHER PUBLICATIONS

J. Maserjian et al, "Monolithic III-V/silicon spatial light modulator", *Applied Optics*, vol. 28, No. 18, p. 3967 (15 Sep. 1989).

D. J. McKnight et al, "Development of a spatial light modulator: a randomly addressed liquid-crystal-over nMOS array", Applied Optics, vol. 28, No. 22, pp. 4757-4762 (15 Nov. 1989).

K. M. Johnson et al, "Motivations for using ferroelectric liquid crystal spatial light modulators in neurocomputing", *Applied Optics*, vol. 28, No. 22, pp. 4888-4899 (15 Nov. 1989).

N. Collings, et al, "Evolutionary development of advanced liquid crystal spatial light modulators", *Applied Optics*, vol. 28, No. 22, pp. 4740-4747 (15 Nov. 1989).

L. K. Cotter et al, "Ferroelectric-liquid-crystal/-silicon-integrated-circuit spatial light modulator", *Optics Letters*, vol. 15, No. 5, pp. 291-293 (Mar. 1, 1990).

A. L. Lentine et al, "Quantum well optical tri-state devices", *Applied Optics*, vol. 29, No. 8, pp. 1157-1160 (10 Mar. 1990).

D. A. B. Miller, "Quantum-well self-electro-optic effect devices", *Optical and Quantum Electronics*, vol. 22, Special Issue on Charge Transport Nonlinearities, pp. S61-S98 (1990).

SLM PIXEL ARRAY

SPATIAL LIGHT MODULATORS FOR INCOHERENT/COHERENT MULTIPLEXED HOLOGRAPHIC RECORDING AND READOUT

ORIGIN OF INVENTION

The U.S. Government has certain rights in this invention pursuant to Contract No. F49620-87-C0007, awarded by the Department of the Air Force, and to Grant No. AFOSR-89-0466, awarded by the Defense Advanced Research Projects Agency through the Department of the Air Force.

This is a continuation division of application Ser. No. 07/505,790, filed Apr. 6, 1990, now U.S. Pat. No. 5,121,231.

TECHNICAL FIELD

The present invention relates to optically addressed spatial light modulators with application to multiplexed volume holographic recording, readout, and interconnections, and, more particularly, with application to photonic interconnections, photonic implementations of neural networks, and multiplexed holographic optical elements.

BACKGROUND ART

Research in optical implementations of neural networks has included (1) systems with one-dimensional arrays of neuron units with two-dimensional interconnections and (2) systems with both one and two-dimensional arrays of neuron units with three-dimensional volume interconnection media. The former approach does not appear suitable, due to inability to scale up to significantly larger networks than those implementable using electronics. The latter approach is currently under active investigation in a number of laboratories.

Much of the optical research has been very creative and has added important elements to an understanding of optical neural network implementations. Notwithstanding this, however, the current status is that most three-dimensional optical implementations have been specific to one neural network model, usually an associative memory. To the best of the inventors+ knowledge, none have demonstrated both positive and negative weights efficiently in a working, scalable system and none have demonstrated a learning system with a large number of neuron units and independent interconnections with high connectivity (i.e., with the number of independent interconnections much greater than the number of neuron units).

In a photonic neural network implementation, one- and two-dimensional spatial light modulators can be used to represent arrays of neuron units. Each individual pixel within the spatial light modulator then represents an individual neuron unit, which must incorporate capability for optical fan-in of the inputs, a nonlinear functional transformation, and optical fan-out of the outputs.

Although a wide range of both electrically addressed and optically addressed spatial light modulators have been proposed previously for a variety of applications, these approaches have a number of disadvantages for use in the specific applications envisioned herein, including (a) relatively low frame rates; (b) low dynamic range (many, in fact, are binary and therefore not suitable for analog applications); (c) low contrast ratio; (d) no provision for incorporation of application-specific nonlinear relationships between the inputs and the outputs; (e) no provision for the representation of both positive and negative input/ouput signals; (f) little or no optical-to-optical gain to allow for signal level compensation and cascadability; and (g) susceptibility to signal corruption resulting from a reliance on a single channel rather than a dual rail approach with differential signal amplification.

It is to these ends of producing an optically addressed spatial light modulator technology for use in complex interconnection networks and the recording and readout of holographic optical elements that the principal invention described herein is directed.

In system involving large numbers of operations, such as neural networks, telecommunications interconnections for long distance switching, and interconnections in digital computing, it is desirable to use multiplexed volume (thick) holography for storage of the interconnections, since this permits the storage of much more information than can be done in planar (thin) holograms. In the case of holographic optical elements, the utilization of a volume holographic medium permits the encoding of complex space-variant optical functions.

In forming multiplexed volume holograms, one of three approaches is typically taken: (1) sequential, which involves several temporally-sequenced (and hence incoherent) exposures of the hologram, done by rotating or translating the hologram (or the source beam or the object beam); (2) simultaneous and fully coherent, which involves the use of two or more mutually coherent beams, each encoded with information and serving as a reference beam for the other(s); and (3) some combination of sequential and simultaneous fully coherent.

The first approach has the major disadvantage that temporal sequencing is time-consumptive, which can be of considerable importance in applications envisioned herein, for which the number of independent interconnections that must be recorded is extremely large. Also, in many holographic recording materials, sequential exposures tend to erase previously recorded information, leading to the necessity of incorporating unwieldy programmed recording sequences in order to result in the storage of a predetermined set of interconnections.

The second approach is designed to circumvent the above sequencing difficulties, but suffers instead from the incoherent recording of unwanted interference patterns (holograms) that give rise to deleterious crosstalk among the various (supposedly independent) reconstructions, as described in more detail below.

The third approach is subject both to sequential recording time delays and the necessity for programmed recording schedules, as well as to the generation of undesirable crosstalk. As such, none of the previously employed multiplexed recording techniques allows for the generation of three-dimensional, truly independent interconnections between two or more two-dimensional planar arrays within the context of a temporally efficient recording scheme.

In all of the prior art approaches to the holographic recording of a multiplexed interconnection, two primary forms of interchannel crosstalk are encountered to a greater or lesser extent. Coherent recording crosstalk arises from the simultaneous use of multiple object reference beams, all mutually coherent with each other. The mutual coherence causes additional interconnections to be formed other than those desired. Reconstruction with independently valued inputs results in the generation of output beams that cross-couple through the undesired interconnection pathways, which compromises the independence of the desired interconnection channels.

A second, unrelated form of crosstalk arises due to beam degeneracy, which occurs whenever a single object beam is used with a set of reference beams to record the fan-in interconnect to a single output node (e.g., neuron unit in the case of the photonic implementation of neural networks). (Fan-in is the connection of multiple interconnection lines to a common output node.) This latter form of crosstalk is present even when the set of object beams is recorded sequentially.

Of at least equally serious consequence is the optical throughput loss that results from interconnection fan-in so constructed as to exhibit beam degeneracy. In many well-documented cases, this loss is severe, resulting in at least an $(N-1)/N$ loss (or, equivalently, a $1/N$ throughput efficiency) for the case of an N-input, N-output inter-connection system, as reported by J.W. Goodman, *Optica Acta*, Vol. 32, pages 1489-1496 (1985). This is a truly daunting loss factor for interconnection systems such as those envisioned for neural networks, which may both re-quire and be capable of $10^5$ to $10^6$ inputs and outputs.

In the prior art, few attempts have been made to address the extremely important technological problem of duplicating the contents of a fully recorded, heavily multiplexed volume holographic optical element or interconnection device, particularly in the case of neural network interconnections. For example, to the inventors' knowledge, there is no known prior technique for rapid copying of a volume hologram that is angularly multiplexed in two dimensions.

In the case of neural network interconnections, the training and/or learning sequences may be quite involved; in some cases, the training and/or learning sequences may result in a unique interconnection, which may not be reproducible in and of itself at all. In such cases, it is desirable to replicate the contents of the interconnection medium in such a manner that a fully functional copy is produced, as characterized by a complete operational set of interconnections indistinguishable from those implemented from the master. The method of replication must not demand an extremely lengthy recording sequence, must not be inefficient in its utilization of the programmed recording schedule, and/or the total optical energy available for reproduction purposes, and must not induce additional optical throughput loss or interchannel crosstalk beyond that already incorporated in the master.

It is to these ends of producing a method for holographically recording complex interconnection networks and holographic optical elements in a timely manner without significant interchannel crosstalk and/or fan-in loss that the invention described both herein and in the parent application (now U.S. Pat. No. 5,121,231, isued Jun. 9, 1992) is directed.

DISCLOSURE OF INVENTION

In accordance with the invention described in the parent application (now U.S. Pat. No. 5,121,231, issued Jun. 9, 1992), incoherent/coherent multiplexed holographic recording for photonic interconnections and holographic optical elements is provided. As a part of the invention, apparatus for providing multiplexed volume holographic recording comprises:

(a) means for providing an array of coherent light sources that are mutually incoherent;

(b) means for simultaneously forming an object beam and a reference beam from each coherent light source, thereby forming a set of multiplexed object beams and a separate set of multiplexed reference beams;

(c) means for either independently modulating each object beam, or spatially modulating a set of object beams so that all object beams are identically modulated;

(d) means for either independently modulating each reference beam, or spatially modulating a set of reference beams so that all reference beams are identically modulated;

(e) a holographic medium capable of simultaneously recording therein a holographic interference pattern produced by at least a portion of the set of all modulated multiplexed object beams and of the set of all modulated multiplexed reference beams pairwise, with all such pairs being mutually incoherent with respect to one another; and (f) means for directing at least a portion of the set of modulated object beams and of the set of modulated reference beams onto the holographic medium and for interfering the portion of the modulated object beams and of the set of modulated reference beams, pairwise, inside the holographic medium.

Although the primary mode of multiplexing is angular, spatial and/or wavelength multiplexing may also be incorporated.

Further in accordance with the invention described in the parent application (now U.S. Pat. No. 5,121,231, issued Jun. 9, 1992), the above apparatus is provided with means for blocking the set of object beams such that at least a portion of the set of reference beams (either modulated or unmodulated) reconstruct a stored holographic interference pattern. In one embodiment, the reconstructed pattern is angularly multiplexed and detected in such a manner as to produce an incoherent summation on a pixel-by-pixel basis of the reconstructed set of object beams. In this manner, multiplexed volume holographic recording and readout are provided.

The architecture and apparatus of the invention significantly reduce coherent recording crosstalk and beam degeneracy crosstalk, and permit simultaneous network initiation, simultaneous weight updates, and incoherent summing at each output node without significant fan-in loss.

Specific implementations to neural networks, telecommunication interconnections (e.g., local area networks and long distance switching), interconnections for digital computing, and multiplexed holographic optical elements are provided.

In the parent application (now U.S. Pat. No. 5,121,231, issued Jun. 9, 1992), apparatus for copyinq a multiplexed volume hologram is further provided, comprising:

(a) means for providing an array of coherent light sources that are mutually incoherent;

(b) means for forming two reference beams from each coherent light source, thereby forming two sets of multiplexed reference beams, each set at a different location;

(c) means for directing the first set of reference beams onto the original multiplexed volume hologram to thereby form a set of output beams;

(d) means for directing the second set of reference beams onto a secondary holographic recording medium;

(e) means for directing the set of output beams from the original multiplexed volume hologram onto the secondary holographic recording medium, with path lengths sufficiently identical to the reference beam path lengths to permit coherent interference, pairwise, between the output beams and the second set of reference beams, inside the secondary holographic recording medium; and (f) means for simultaneously recording in the secondary holographic medium a holographic interference pattern produced by the set of output beams and the second set of reference beams, thereby forming the substantially identical multiplexed volume hologram.

In accordance with the present invention, novel spatial light modulators used in the practice of the invention are provided, combining means for modulating a first set of light beams, means for detecting a second set of light beams, and electronics for altering the modulation in response to the detected beams. The novelty is achieved by modifying either the functionality or the configuration of the spatial light modulators described in the prior art.

As a part of the present invention, an optically addressed spatial light modulator comprises a plurality of pixels on at least two substrates, each of the pixels comprising:

(a) modulator means to modulate, in at least one of transmission and reflection, at least one of phase and amplitude of incident light from a first source, the modulation means situated on a first substrate of the at least two substrates;

(b) detector means to detect light from a second source, the detector means situated on a second substrate of the at least two substrates, and the detector means generating an input electrical signal;

(c) electronic means comprising nonlinear analog integrated electronic signal processing circuitry, the electronic means situated on at least one of the two substrates and implementing a pre-specified input/output function, thereby generating an output electrical signal in response to the input electrical signal, the output electrical signal being suitable for driving the modulator means;

and at least a substantial subset of pixels further comprising:

(d) connecting means for electrically connecting and physically bonding the first substrate to the second substrate, the connecting means providing parallel electrical communication between the two substrates, thereby enabling the modulator means to be controlled by the prespecified input/output function of the input electrical signal;

and at least one of the first substrate and the second substrate being substantially optically transparent to the light from at least one of the write sources and the read sources.

In one embodiment, the optically addressed spatial light modulator is configured to differentially amplify the inputs to two separate detectors within each pixel, and to transform the resulting difference signal in a sigmoidal manner into two output signals applied to two separate optical modulators located within the same pixel. In a second embodiment, two juxtaposed optical modulators are used within each pixel to independently control the amplitude and phase of the output beam(s). In a third embodiment, the electronic circuitry within each pixel is designed to phase modulate the output beam(s) in such a manner as to provide mutual incoherence among the individually coherent output beams from the set of pixels that comprise the array. In these two latter embodiments, optical addressing may not be required.

Such spatial light modulators are critical for providing the functional transformation of optical beams in arbitrarily weighted and independent interconnections, which in turn are of potential importance in the development of neuro-optical computers, as well as photonic interconnection networks and multiplexed holographic optical elements.

BRIEF DESCRIPTION OF THE DRAWINGS

FIG. 1 is a generalized interconnection, with both fan-out and fan-in;

FIG. 6A is a schematic diagram of optical apparatus for recording of doubly angularly multiplexed holograms, each a hologram of a 2-D array of pixel values, while

FIG. 19A is a schematic diagram of means for providing the source array of FIG. 18 in the case of a 1-D wavelength division multiplexed (WDM) input line array and a 1-D wave-length division multiplexed output line array, showing the center optical frequency $\nu$ increasing along one direction and the incorporation of mutual incoherence within a frequency band $\Delta\nu$ about each central optical frequency $\Delta$ along a different, substantially orthogonal direction, while

BEST MODES FOR CARRYING OUT THE INVENTION

A. General

1. Introduction

The description which follows is primarily directed to spatial light modulators for application to neural networks. However, it will be appreciated by those skilled in the art that a major component of the architecture and apparatus is generic to a number of technologies, including telecommunications, digital computing, and holographic optical elements. Specific applications to these are discussed below.

In considering the teachings of the invention, it is essential to differentiate between two basic types of optical interactions (as determined by the nature of the optical signals involved): incoherent and coherent. Incoherent interactions occur whenever the input signals temporally dephase over the relevant time of observation (detector temporal integration window), in that they are either broadband (not monochromatic) or are narrow band (nearly monochromatic) but separated in optical frequency by more than the inverse of the observation time.

Interactions in which the input optical signals spatially dephase over the spatial aperture of the relevant detector wherever the output is utilized (detector spatial integration window) are also incoherent for all practical purposes, and will obey certain summation rules. Coherent signals simultaneously maintain a constant phase relationship over the detector spatial and temporal integration windows. As will be appreciated by those skilled in the art, a holographic recording medium can be viewed as a three-dimensional detector with a characteristic response time that determines its temporal integration window.

From these remarks, it can be seen that it is quite important to understand the distinction between coherent (or incoherent) light and coherent (or incoherent) interactions as defined by the eventual detector configuration and operational parameters. For example, it is perfectly acceptable to consider a situation in which two mutually coherent (temporally) optical beams interact to produce an interference pattern with a spatial scale small compared with the relevant detector aperture. In such cases, the interaction will in fact follow incoherent summation rules, as the detector effectively integrates the spatially varying interference pattern to produce exactly the same result as the interaction of two mutually incoherent (temporally) optical beams.

Figure 1:
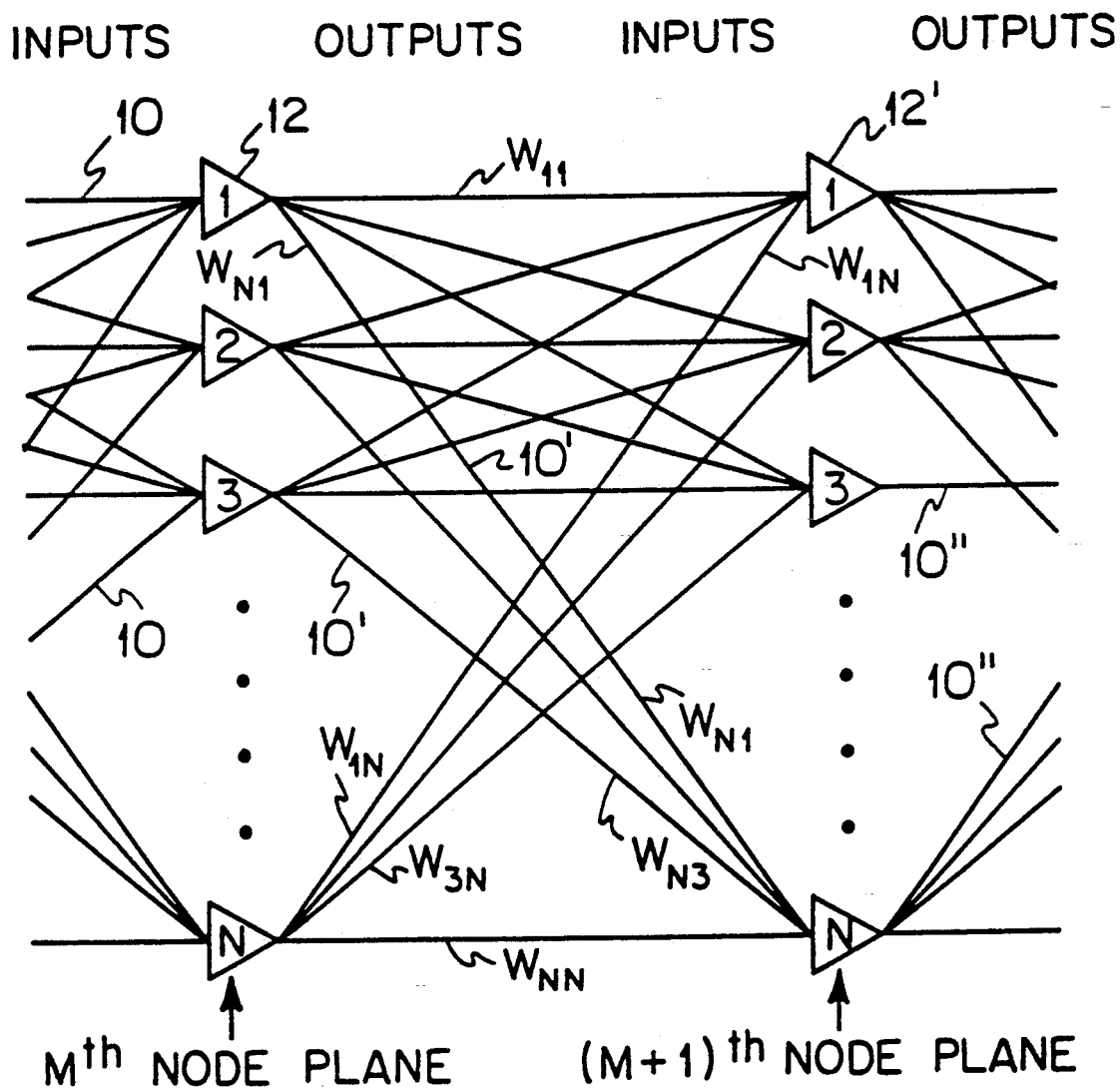

Referring now to the drawings, wherein like numerals of reference designate like elements throughout, FIG. 1 depicts a generalized interconnection scheme, showing both fan-in of input beams 10, 10' to nodes 12, 12', respectively, and fan-out of output beams 10', 10'' from the nodes.

The section of the interconnection shown depicts the fan-in to the $m^{th}$ node from the $(m-1)^{th}$ node plane (not shown), a fully connected layer in which the interconnections fan out from each node 12 labeled 1 through N to the nodes labeled correspondingly 1 through N in the $(m+1)^{th}$ node plane wherein full fan-in is effected, and fan-out from the $(m+1)^{th}$ node plane to the $(m+2)^{th}$ node plane (not shown). In some interconnection schemes, the $m^{th}$ node plane and the $(m+1)^{th}$ node plane are one and the same, consisting therefore of a set of nodal outputs fully interconnected to the corresponding set of nodal inputs in a feedback arrangement.

The weights $w_{ij}$ are shown to indicate that each (analog) interconnection path modifies the output from a given node by means of the multiplication weight $w_{ij}$ before fan-in is performed with an appropriate summing operation at each node input. The weight labeling scheme employed is as shown, such that the weight $w_{ij}$ interconnects the $j^{th}$ nodal output in a given plane to the $i^{th}$ nodal input in the succeeding plane.

Figure 2:
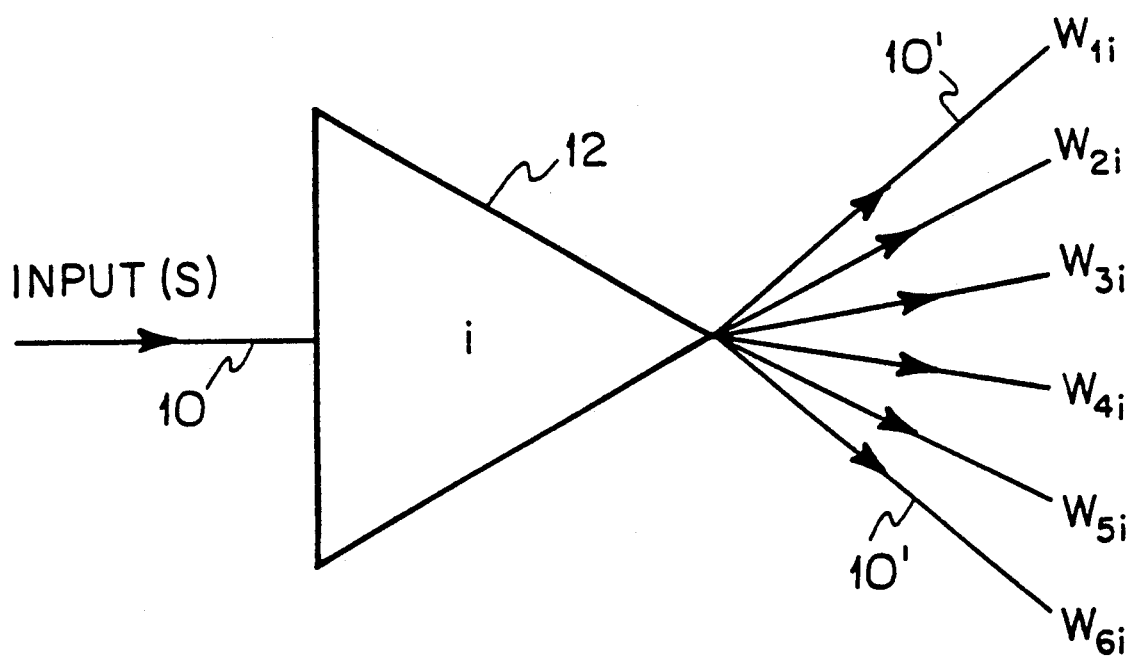
FIG. 2 is a schematic diagram of fan-out, showing interconnection pathways and the implementation of analog weights.

FIG. 2 depicts fan-out of a plurality of output beams 10' from a node 12 (i.e., the $i^{th}$ node) on which at least one input beam 10 is incident. Each beam 10' is propagated to the next node with a separate and independent analog weight $w_{ij}$ as noted above, which is assigned to each interconnection path.

As depicted in FIG. 2, for the purposes of this invention, the output value from each given node is common, such that the interconnections represent true fan-out rather than the individual interconnection of multiple output ports from a single node.

Figure 3:
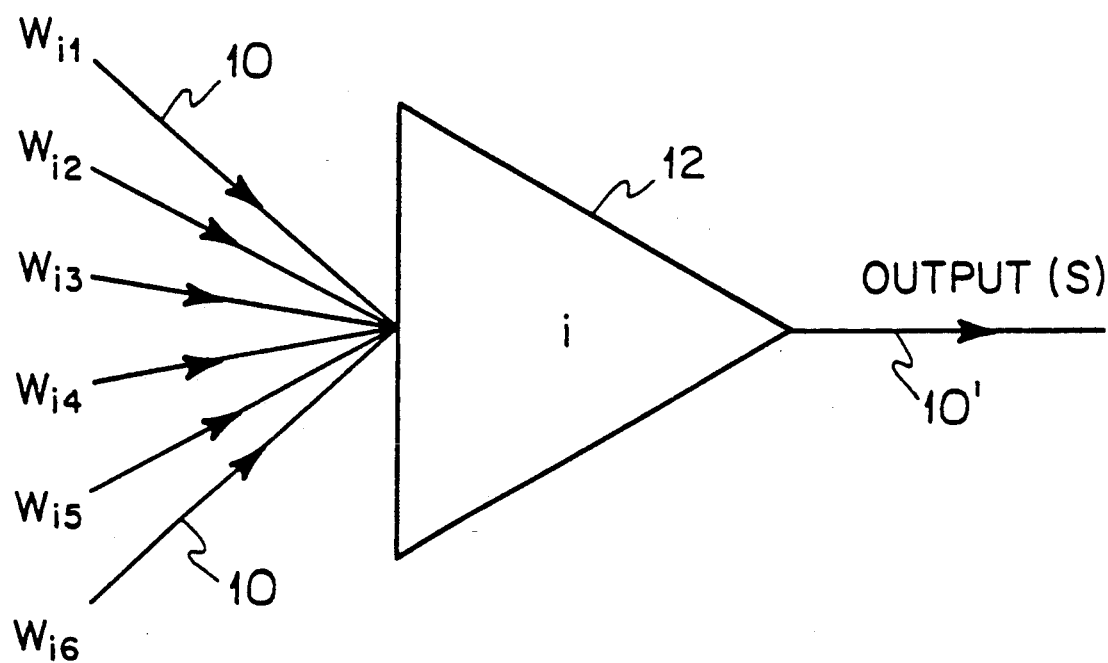
FIG. 3 is a schematic diagram of fan-in, showing interconnection pathways and the implementation of analog weights.

FIG. 3 depicts fan-in of a plurality of input beams 10 to node 12, generating at least one output beam 10'. Each beam 10 is modified by a separate and independent analog weight $w_{ij}$, assigned to each independent interconnection path. True fan-in is achieved by means of an appropriate summation rule at a single node input, as shown in the Figure.

In FIGS. 1, 2, and 3, the triangular symbol utilized to depict each interconnection node represents not only the indicated direction of data flow through the node, but also the potential for incorporation of an input-to-output control transfer function (e.g., a hard or soft threshold in the case of a neural network) that operates on the fanned-in, summed inputs to produce a single (usually analog) out-put value that is fanned out in turn to the succeeding net-work stage.

Figure 4:
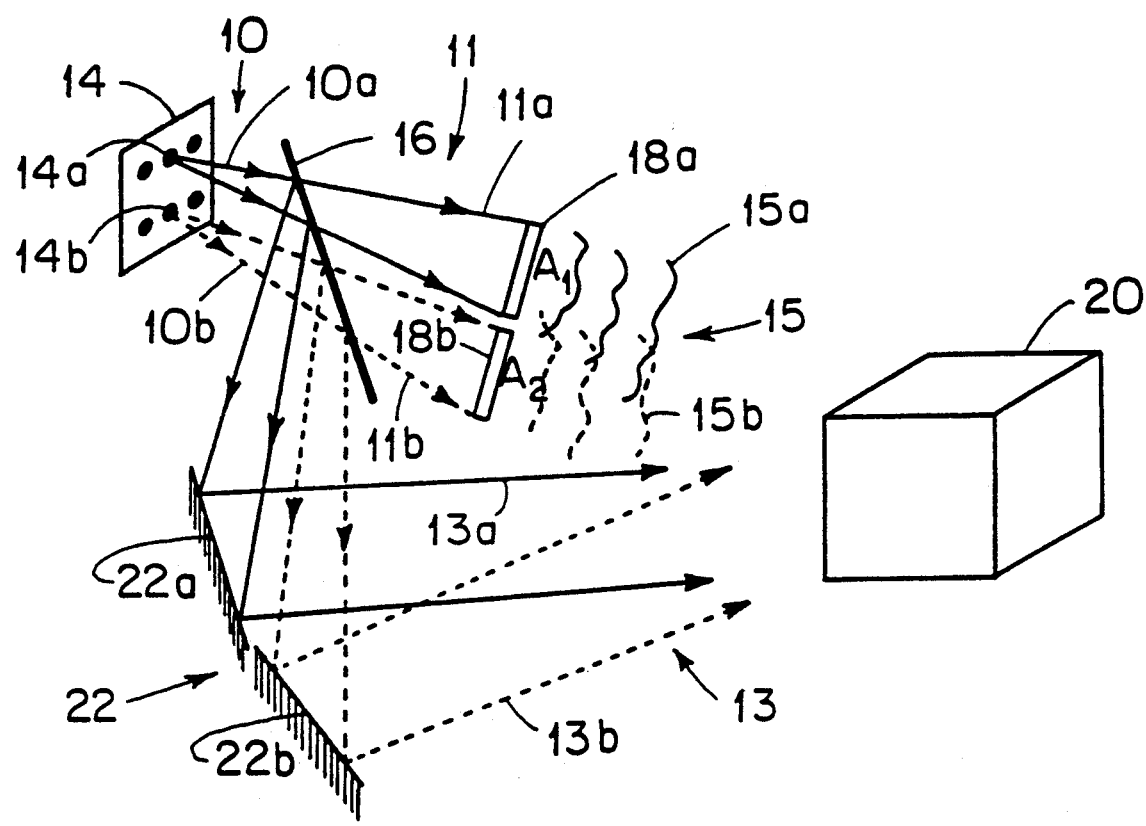
FIG. 4 is a schematic diagram of optical apparatus for simultaneous incoherent/coherent recording of multiplexed holograms, showing angular multiplexing of the reference beam set.
Figure 5:
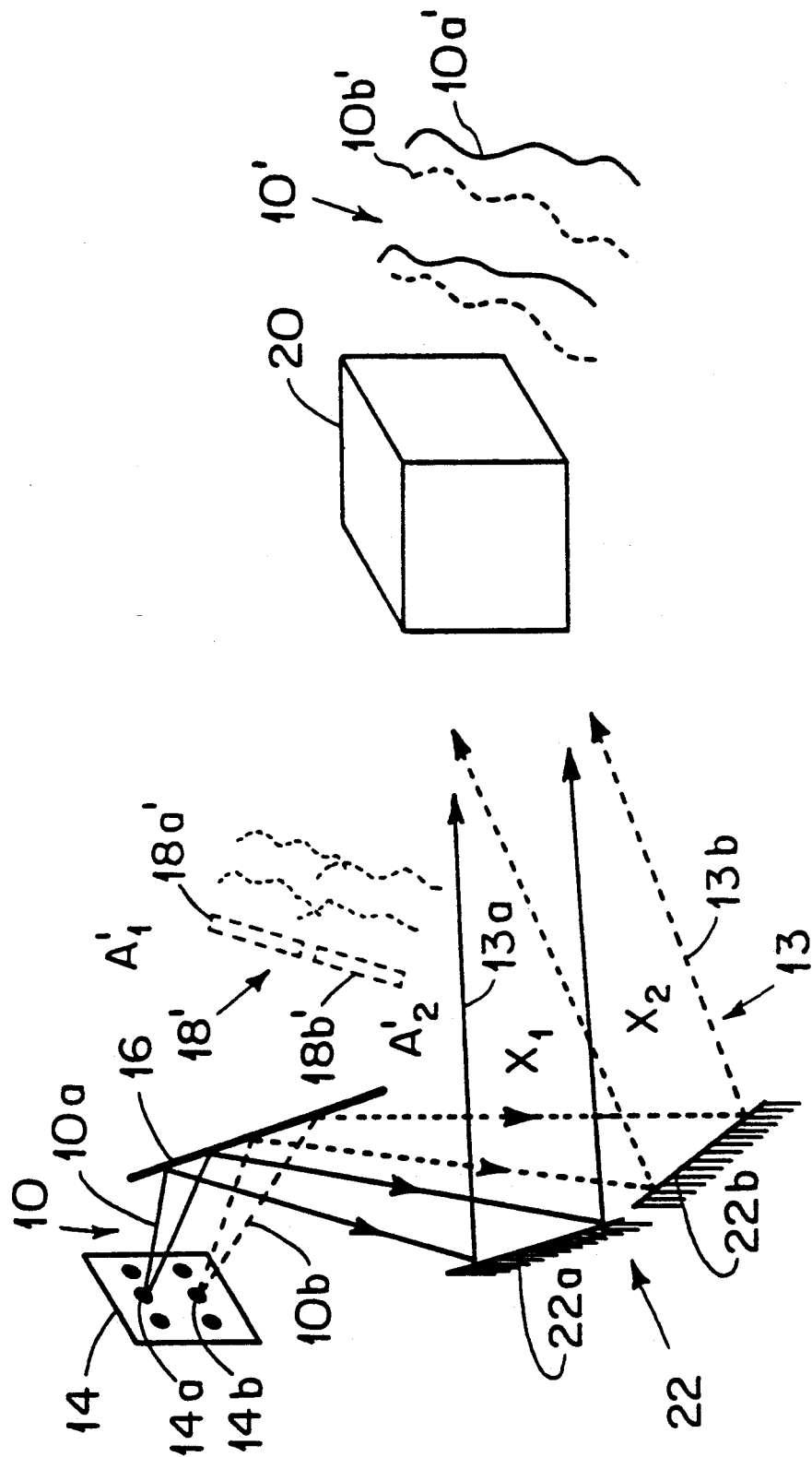
FIG. 5 is a schematic diagram of optical apparatus for either simultaneous or independent readout of multiplexed holograms showing mutual incoherence of readout (reconstructed) beams.

FIGS. 4 and 5 depict schematically how recording (FIG. 4) and reconstruction (FIG. 5) of a set of holograms is accomplished in accordance with the invention. In FIG. 4, an array of coherent but mutually incoherent sources 14 generates a set of beams 10 (two such beams 10a, 10b are shown). A beam splitter 16 forms a set of object beams 11 and a set of reference beams 13. The object beams 11 pass through a set of objects ($A_1$, $A_2$) 18 to form a set of object-encoded beams 15, which impinge on a holographic recording medium 20. The reference beams 13 are reflected from a set of mirrors 22 and also impinge on the holographic recording medium 20, where they interfere with the object-encoded beams 15 pairwise to form holographic interference patterns in the recording medium, as is well-known.

It will be noted that the foregoing apparatus permits simultaneous recording of the objects. Further, a first light source 14a in the source array 14 is used to generate a first set of two beams 11a and 13a which are mutually coherent; these beams derive from beam 10a. A second light source 14b in the source array is used to generate a second set of two beams 11b and 13b, which are mutually coherent; these beams derive from beam 10b. However, since the two light sources 14a and 14b are mutually incoherent, then beams 10a and 10b are mutually incoherent, and the two sets of beams derived therefrom are also mutually incoherent and hence do not mutually interfere to form an interference pattern in the holographic storage medium 20.

While only two light sources 14a, 14b are described, there are, of course, a plurality of such light sources in the source array 14, each generating a coherent pair of object and reference beams, each pair incoherent with all other pairs.

Finally, each of the set of object beams and each of the set of reference beams is independently multiplexed in at least one of angle, space, and wavelength.

In FIG. 5, readout, or reconstruction, is achieved by blocking the object beams 11. In the case of a holographic optical element, the holographic medium 20 may be read out in a physically distinct optical system, in which the reference beam phase fronts illuminating the holographic medium approximate those of the recording system. Readout may be simultaneous and independent, or individual.

In simultaneous and independent readout, output beams 10a' and 10b' are mutually incoherent, and complete control of what is read out is provided; that is, one-half of beam 13a and all of beam 13b, or all of beams 13a, 13b, and 13c (not shown), or other combinations may be controllably used as readout beams, with the modified set of reconstructed output beams incoherently superimposed in space. For clarity, beam 13c is omitted from the drawing. If shown, it would be at yet a different angle from beams 13a and 13b.

In individual readout, any individual readout beam 13j can be modulated and utilized to reconstruct an individual output beam 10a' or 10b' (or 10c', et.) without significant crosstalk.

Virtual images $A_1$, and $A_2'$ are generated from the reconstruction process in the position designated 18' where the objects 18 were located during the recording process, in such a manner that the reconstructions 10' appear to emanate from the virtual images. A key point is that the set of reconstructed images 10, are all mutually incoherent, and hence obey incoherent summation rules in any chosen output plane, as described in more detail below.

Figure 6A:
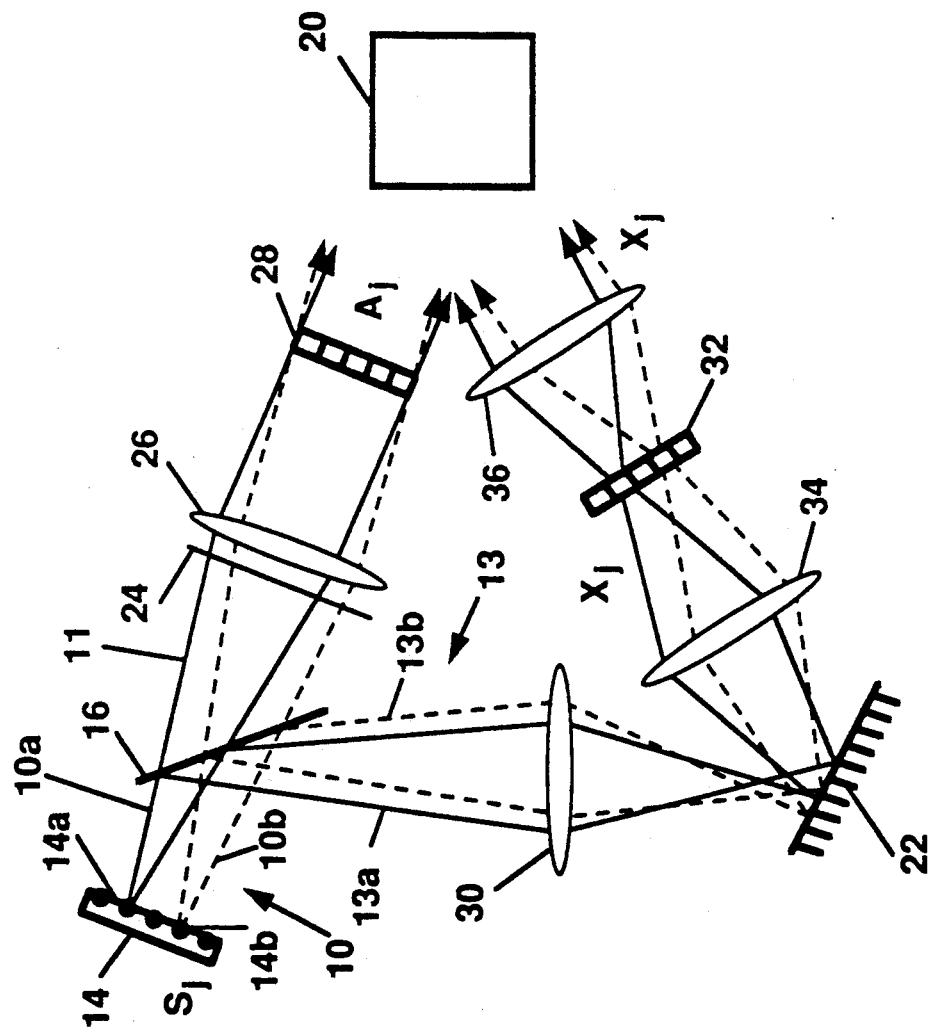

FIG. 6A depicts apparatus suitable for the simultaneous recording of doubly angularly multiplexed holograms, with each hologram comprising a 2-D array of pixel values. A shutter 24 in the path of the set of object beams 11 is used to control passage of the set of object beams to the holographic recording medium 20. During recording, the shutter 24 is open. The set of object beams 11 passes through a lens 26, which approximately collimates the set of beams and directs them toward a first spatial light modulator (SLM) 28. Thus, each pixel of modulator 28 has many mutually incoherent optical beams (angularly multiplexed) passing through it. The set of modulated beams $\{A_j\}$ is incident on the holographic recording medium 20.

The set of reference beams 13 passes through lens 30 and lens 34, reflecting from mirror 22 in the process; their function, together, is to focus each beam onto the corresponding pixel of modulator 32. From the spatial light modulator 32, the set of reference beams 13 is directed into the holographic recorded medium 20 by lens 36, where the reference beams interfere with the object beams to produce a multiplexed hologram with a set of stored interconnection weights. The interconnection weights can be dependent on corresponding products of the form $A_j x_j$, as described above.

Finally, it will be noted that the object beams 11 are all at different angles with respect to each other and that the reference beams 13 are also all at different angles with respect to each other. As a consequence of this angular difference, it will be appreciated that these beams are double (meaning both object and reference beams) angularly multiplexed in the volume hologram 20.

Figure 6B:
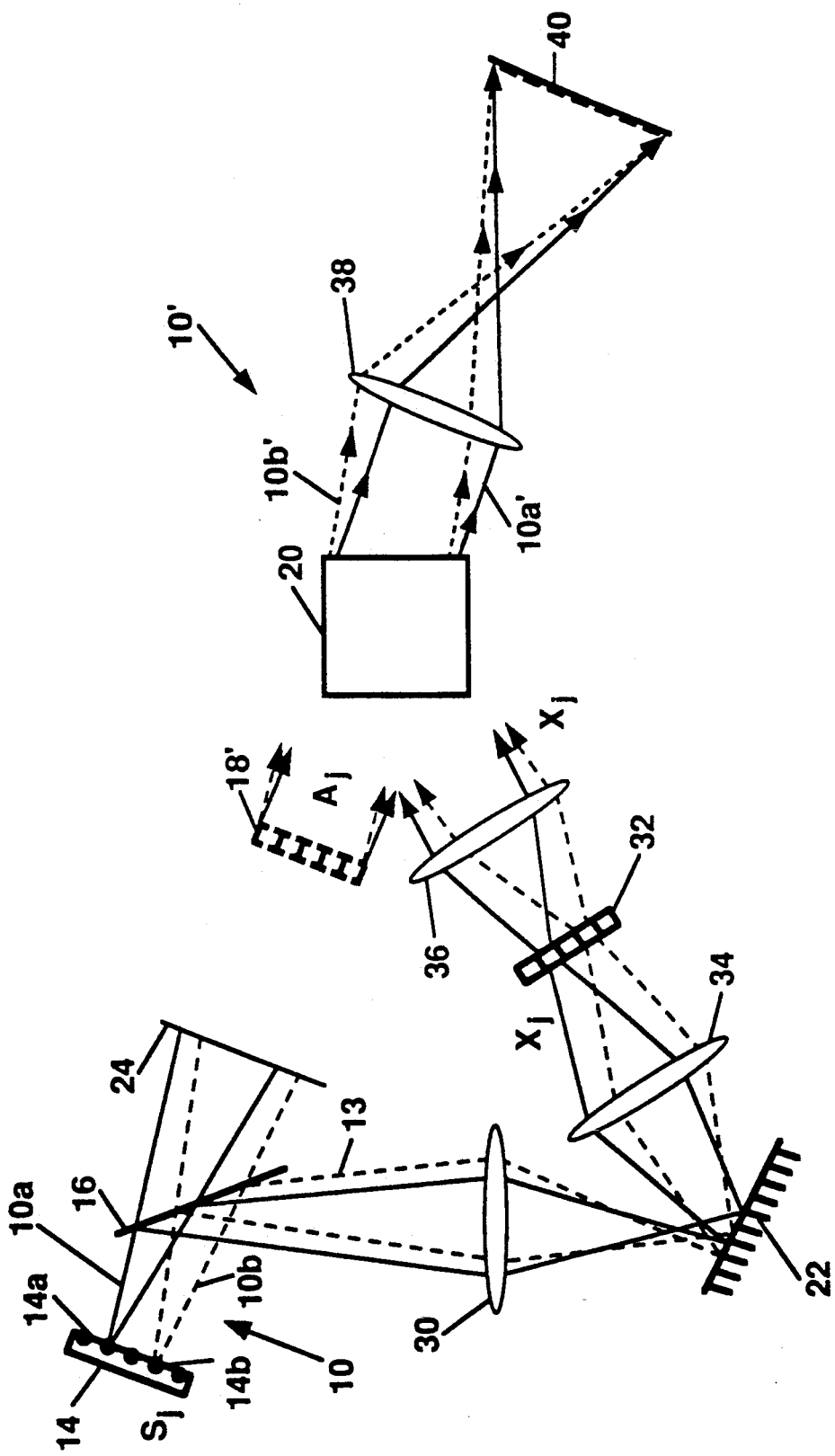
FIG. 6B is a schematic diagram of that portion of the apparatus of FIG. 6A, used in the reconstruction of the recorded images, showing the incoherent summation on the output plane of the set of reconstructed images in pixel-by-pixel registry.

FIG. 6B depicts the apparatus of FIG. 6A, but with the shutter 24 closed, to permit reconstruction of the recorded holograms to generate a set of output beams 10', representing a set of virtual images 18', which is passed through a lens 38 and imaged onto an output plane 40. Each pixel of the superposition image in output plane 40 receives an intensity given by the incoherent summation of a number of terms, the number given by the fan-in to that pixel, which is equal to the number of elements in the source array for the case of fully connected networks. Each individual term in the incoherent summation is in turn the product of a stored interconnection weight $w_{ij}$ multiplied by the intensity of the corresponding reference beam $x_j$ during readout. Hence, the superimposed reconstructions of the separate stored holograms (generating the set of virtual images 18') are incoherently summed pointwise (on a pixel-by-pixel basis in registry). This incoherent/coherent technique reduces the number of spurious gratings written, thereby reducing crosstalk compared with fully coherent simultaneous recording techniques.

2. Source Array

As discussed above, a critical and novel component that leads directly to the unique capability for simultaneous recording of the holograms is a 2-D source array 14, the light emission transmission reflection from which must be coherent within each pixel but mutually incoherent among all pixels. In the case that each pixel comprises more than one modulation element, the light emitted, transmitted through, or reflected from the source array may be either mutually coherent or mutually incoherent within each individual pixel, but should in any case be mutually incoherent among the pixels of the array. In certain applications, it may be advantageous to require mutual incoherence across only a specific portion of the pixels (or modulation elements) within the array. The array size will be determined by the array sizes of the SLMs employed in the architecture, as these will in fact delimit the space-bandwidth product of all of the arrays. Given the geometrical and power dissipation constraints inherent in the preferred SLM design employed herein, array sizes of $\approx 10^4$ to $10^5$ elements per cm$^2$ are currently appropriate. Given further the unique interconnection recording configuration proposed herein, larger array sizes can be configured by mosaic techniques, as the interconnection architecture automatically compensates for irregularities in source location. Arrays can be either geometrically regular or irregular in layout, and either one- or two-dimensional, depending on the specific application envisioned.

There are at least three possible structures that can satisfy the necessary source array requirements. The first is an array of optically isolated surface-emitting or edge-emitting semiconductor lasers, with adequate pixelation to eliminate the potential for inadvertent phase locking. Such pixelation means might include, for example, the separation of individual surface-emitting lasers by wet chemical etching or dry etching of the intervening material, or the optical isolation of each individual surface-emitting laser by the deposition or incorporation of a light blocking layer between a given laser and each of its neighbors within the array.

Let $\Delta \nu$ be the processing-variation-induced or designed difference in center frequencies from one source to the next. The mutual coherence time between sources is determined by the optical bandwidth of the sources (in the case of such bandwidth being greater than $\Delta \nu$) or by $\Delta \nu$ (in the case of $\Delta \nu$ being greater than the individual source band-width).

For typical semiconductor lasers fabricated in the GaAs/AlGaAs system, for example, linewidths of 3 nm are common, which corresponds to a frequency bandwidth of approximately 1 THz. Over time scales characteristic of currently-available photorefractive volume holographic optical interconnections, about 1 msec for power levels characteristic of semiconductor laser sources, this large bandwidth will assure mutual incoherence of the array elements. Total power dissipation assuming 1 mA threshold laser diodes will be under 10 W/cm$^2$, and even then will require careful heat sinking and attention to thermal design. The essential advantages of this approach are the anticipated very high resultant optical intensities of $\approx 5$ W/cm$^2$ that will in turn accelerate the holographic interconnection recording (and copying) process, and the significant technical lever-age enjoyed by this approach due to substantial interest in semiconductor laser arrays for a wide range of potential applications.

For example, vertically emitting semiconductor laser arrays with densities of over two million individual lasers per square centimeter have been fabricated and evaluated successfully, as reported by J.L. Jewell et al, *Optics News*, pages 10–11 (December 1989). These arrays, however, have not been specifically designed to assure mutual incoherence among all of the individual source array elements, which is a critical feature utilized in the practice of this invention.

The first source array structure described above comprises an array of individually coherent sources of illumination that are mutually incoherent. The second and third source array structures described below allow for the use of a single coherent source of illumination in conjunction with appropriate beam-expanding means to provide either uniform or pixelated illumination of an array of phase modulating elements that in turn produce the requisite set of mutually incoherent beams for use in the photonic architecture described herein.

The second source array structure employs a pixelated piezoelectric mirror with an intentionally incorporated space-variant non-uniformity. The array is driven such that each individual high-Q mirror, element is brought into oscillation at a distinct center frequency thereby modulating the incident light beam sufficiently uniquely to provide the required pixel-to-pixel mutual incoherence. For such an array with 10$^4$ elements, each separated by $\approx 2$ kHz to satisfy the mutual incoherency requirements of the holographic interconnect, the required bandwidth is only 20 MHz. This approach has the advantage of potentially very high reliability, with capability for reflecting essentially arbitrarily intense CW or pulsed source beams over a broad wavelength range.

The third source array structure is directly derived from the III-V compound semiconductor-based or other equivalent spatial light modulators discussed below. In this case, a pure phase modulator generates the requisite frequency modulation to guarantee element-to-element mutual incoherence among the set of modulated beams. As will be appreciated by those skilled in the art, many so-called "pure" phase modulators in fact exhibit a degree of residual amplitude modulation that does not compromise their essential functionality in the envisioned application. Frequency separations are generated (set) by replacing the detector/electronics combination associated with each pixel by an electronic ring oscillator or astable, multivibrator with process-variable-induced or design-variable-induced spatial inhomogeneities in the center frequencies across the array.

It is well known to those skilled in the art that stochastic variations in the several process variables characteristic of electronic integrated circuit fabrication such as growth temperature, deposition rate, etch temperature, metallization thickness, as-patterned dimensions of device features, and defects will induce corresponding stochastic variations in asfabricated circuit parameters such as device resistance, device capacitance, gate threshold voltage, interconnection resistance, and interconnection capacitance. In either an electronic ring oscillator or an electronic astable multivibrator, the resultant center frequency of oscillation depends to first order on the aggregate of all of these circuit parameters, such that stochastic variations will result in spatial inhomogeneities in the center frequencies across the array. Likewise, such spatial inhomogeneity can easily be incorporated by varying the design parameters of various circuit components in either a regular or random fashion across the array.

The most demanding requirement for this application is the necessity of achieving greater than $\pi$ phase variation with minimal associated amplitude modulation. This in turn will require $\Delta(nd)$ products greater than $\frac{1}{2}$ (optical path length differences given by either a change in the refractive index n multiplied by the active device thickness d, or a change in device thickness or displacement multiplied by the effective refractive index of the active region, or both). Such $\Delta(nd)$ products may prove to be difficult to achieve, for example, in traditional multiple quantum well (MQW) spatial light modulators based on the compound semiconductor system, and may require the utilization of unusually large piezoelectric effects in strained layer superlattices, or the incorporation of coupled double quantum wells (CDQWs) in modulation doped NIPI structures or planar asymmetric Fabry-Perot cavities.

Implementation utilizing a wide variety of candidate spatial light modulator technologies such as liquid crystal light valves or deformable membrane devices may prove particularly suitable for generation of the degree of mutual incoherence required of the source array.

3. Copying of Multiplexed Volume Holograms

Also in accordance with the invention, apparatus for copying an original multiplexed volume hologram to form an identical multiplexed volume hologram is provided. The apparatus and method for copying a multiplexed volume hologram of planar objects that are reconstructed as virtual images is described first, followed by a description of its generalization to multiplexed volume holograms of planar amplitude objects, phase objects, 3-D objects, and multiplexed volume holograms that reconstruct real images.

Figure 7:
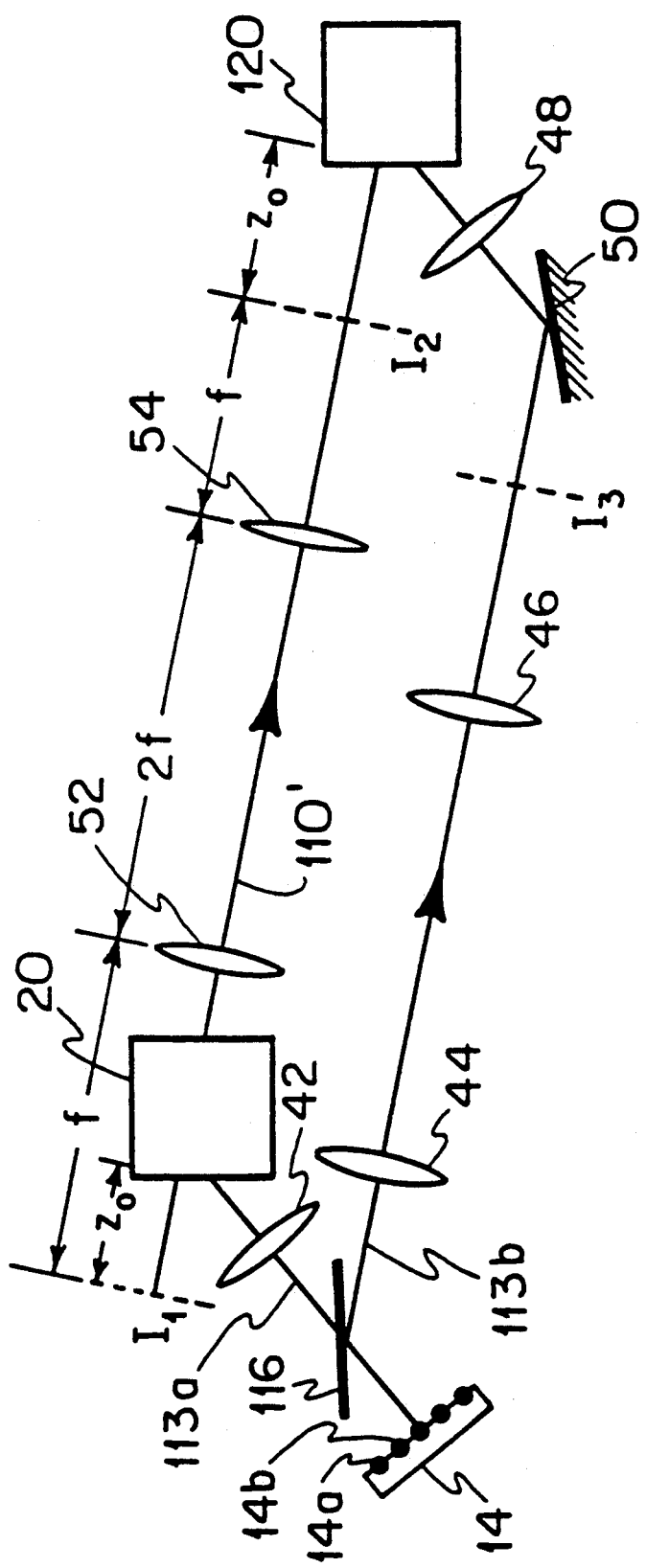
FIG. 7 is a schematic diagram of optical apparatus for one-step copying of the entire multiplexed holographic record, showing the use of simultaneous readout by means of mutually incoherent readout beams.

The apparatus is schematically depicted in FIG. 7 and employs the original multiplexed volume hologram 20 (master) to generate a substantially identical secondary multiplexed volume hologram 120 (copy). An array 14 of coherent light sources that are mutually incoherent is employed, as described above. A beam splitter 116 is used to form two reference beams 113a, 113b, from each coherent light source 14a, 14b, etc., thereby forming two sets of angularly multiplexed reference beams, each set at a different location, but otherwise substantially identical. The first set of reference beams 113a is directed onto the original multiplexed volume hologram 20, such as by lens 42, to thereby form a set of output beams 110, The second set of reference beams 113b is directed onto a secondary holographic recording medium 120. In certain applications pertinent to the invention, the two sets of reference beams may be either wavelength multiplexed or spatially multiplexed or any combination of angularly, spatially, and wavelength multiplexed.

Reference beams 113b are made to have phase fronts at recording medium 120 that are substantially identical to the phase fronts of reference beams 113a at the recording medium 20. This can be provided, for example, by relay optics 44, 46, and 48. If lenses 44 and 46 each have focal length $f_r$, then the optical distance from source array 14 to lens 44 is $f_r$, from 44 to 46 is $2f_r$, and from 46 to $I_3$ is $f_r$, where $I_3$ is an image of the source array. The optical distance from source ar-ray 14 to hologram 20 is equal to the optical distance from $I_3$ to recording medium 120. The position of lens 42 with respect to hologram 20 is the same as the position of lens 48 with respect to recording medium 120. Beamsplitter 116 and reflecting surface 50 direct the reference beams 113 in the desired directions. Thus, the optical path from beam-splitter 116 to hologram 20 is essentially identical to that from mirror 50 to recording medium 120.

The set of reconstructed output beams 110' is directed from the original multiplexed volume hologram 20 onto the secondary holographic recording medium 120, such as by lenses 52, 54, with path lengths sufficiently identical to the reference beam path lengths to permit coherent inter-ference, pairwise, between the output beams and the second set of reference beams, inside the secondary holographic recording medium.

In FIG. 7, plane $I_1$ corresponds to the virtual image plane of the objects, obtained from the reconstructed beams of the holograms recorded in the medium 20. (Extensions to non-planar objects are given below.) The images in $I_1$ can be completely overlapping (as in the case of FIGS. 6A and 6B), partially overlapping, or non-overlapping in space (as in the case of FIGS. 4 and 5).

Lenses 52 and 54, of focal length f, are chosen to create an image of plane $I_1$ at plane $I_2$. In this embodiment, plane $I_1$ is chosen to be coincident with the virtual image plane of the hologram. Plane $I_1$ exists at a distance plane $I_2$ of $I_1$ exists at the same distance $Z_0$ from the entrance face of the holographic recording medium 120.

Due to the geometry of relay optics 52 and 54, the beams from $I_2$ are incident on recording medium 120 with substantially identical phase fronts as the original (primary) object beams were incident on hologram 20, with the exception of an exact spatial inversion about the optical axis. (Such spatial inversion can be removed, if desired, by inserting another f-2f-f optical relay system in path 110', from $I_2$ to another real image plane $I_2$. The path of the reference beams 113b is similarly changed if needed to maintain the requisite pairwise coherence. In the remainder of this section on copying, the light distribution at $I_2$ that is subsequently incident on the holographic recording medium will be referred to as if it were not spatially inverted, with the understanding that if a non-inverted copy is desired, the optics can be changed as described above.

A set of holographic interference patterns is then simultaneously recorded in the secondary holographic medium 120 by the set of output beams 110' and the second set of reference beams 113b, thereby forming the substantially identical multiplexed volume hologram.

Applications and extensions of this copying apparatus and method to other types of multiplexed holograms will now be discussed. First, all of the copying methods and apparatus described herein apply to multiplexed holograms originally recorded simultaneously with an array of individually coherent but mutually incoherent sources; in this case, the copying apparatus reference beams 113a must approximate the reference beams 13a used during the original recording of hologram 20. In addition, these methods and apparatus also apply to sequentially recorded multiplexed volume holograms, since the net result within the medium is an incoherent superposition of the holographic interference patterns. Again, the copying can be made in one step, the requirement being that the set of reference beam phase fronts at hologram 20 during copying approximate the set of reference beam phase fronts that were used over time during recording of the original hologram.

The same holographic recording apparatus and method described above can copy multiplexed volume holograms of a set of planar phase objects that were recorded, for example, using a phase modulator at location 28 of FIG. 6A. This is possible because the imaging optics 52 and 54 in effect copy not only intensity information but also phase information from $I_1$ to $I_2$. This further permits generalizations to multiplexed volume holograms of 3-D objects (again, of a set of original stored holograms that was simultaneously or sequentially recorded), wherein the phase fronts from $I_1$ have been relayed to $I_2$ (or $I_2'$ in the case of having no inversion). In this case, the plane $I_1$ represents the intensity and phase information of each beam propagating from each of the original 3-D objects.

This apparatus and method can be extended to copies of holograms that reconstruct real images. Conceptually, in this case, the plane $I_1$ is located a distance $Z_0$ after hologram 20, and the subsequent relay optics 52, 54 are positioned the same, relative to $I_1$, as in FIG. 7. Similarly, $I_2$ (or $I_2'$) is positioned the same, with respect to recording medium 120, as $I_1$ is positioned with respect to hologram 20.

It should be noted that $Z_0$ does not have to be chosen exactly as described above; in fact, depending on aberrations and apodization effects, $Z_0$ can, in many cases, be set equal to 0 (so that in the case of planar objects, for example, $I_1$ is not coincident with the virtual image plane of the recorded objects).

By incorporating independent control of the sources in the source array, subsets of the original multiplexed hologram 20 can be copied onto recording medium 120. This is useful, for example, in a manufacturing environment in which different copies are meant to have different holographic recordings, each a subset of the set of holographic recordings encoded in master, complete multiplexed hologram. The sources in array 14 that correspond to the desired holograms to be copied are turned on, and the others are left off. Alternatively, a spatial light modulator can be employed in conjunction with a lens to modulate an image plane of the source array 14, in order to provide independent source control.

This functionality is also useful in the cases of interconnection networks and neural networks, in which a portion of the master hologram is to be copied, to be later used to refresh that part of the original hologram. Alternatively, the copy can be used as the interconnection hologram, and the master as a library of interconnection patterns, subsets of which are loaded into the copy 120 to implement a desired interconnection.

Finally, it will be appreciated that the apparatus and method can also be used to make non-identical copies, in which there is magnification of the spatial extent of the stored images by incorporating optical magnification into the path 110' (or magnification of angles by incorporating optical demagnification into path 110'). Alternatively, the reference beam illumination of the copy 120 can be changed relative to the original by changing the phase fronts incident on the copy. This is needed for applications in which a set of hard-to-generate stored patterns are to be transferred from a master multiplexed hologram to a copy, but the copy is to be used in an optical system that utilizes a different set of reference beams to recall the stored holographic images. In this case, the optics in path 113b are chosen to make the phase fronts incident on recording medium 120, substantially identical to the desired new reference beam phase fronts that will be used to reconstruct the copy. In these non-identical copying cases, the new optics must be chosen so that the optical path length constraint between reference beams and object beams, pairwise, is still satisfied, to assure interference between the mutually coherent beams pairs.

A furtherance of the capability to make non-identical copies is that of wavelength conversion, in which the recording wavelength generated by the source array is not the same as the wavelength to be utilized in reconstruction. This feature is particularly useful in the case of currently-available photorefractive volume holographic recording materials, which can be non-destructively read out (reconstructed) only at a wavelength of relative photorefractive insensitivity. In this case, the Bragg condition can be satisfied by altering the scale of the source array used for copying in comparison with the scale of the source array used for subsequent reconstruction, and by reconfiguring the optics between the source array and the holographic recording medium.

Figure 8:
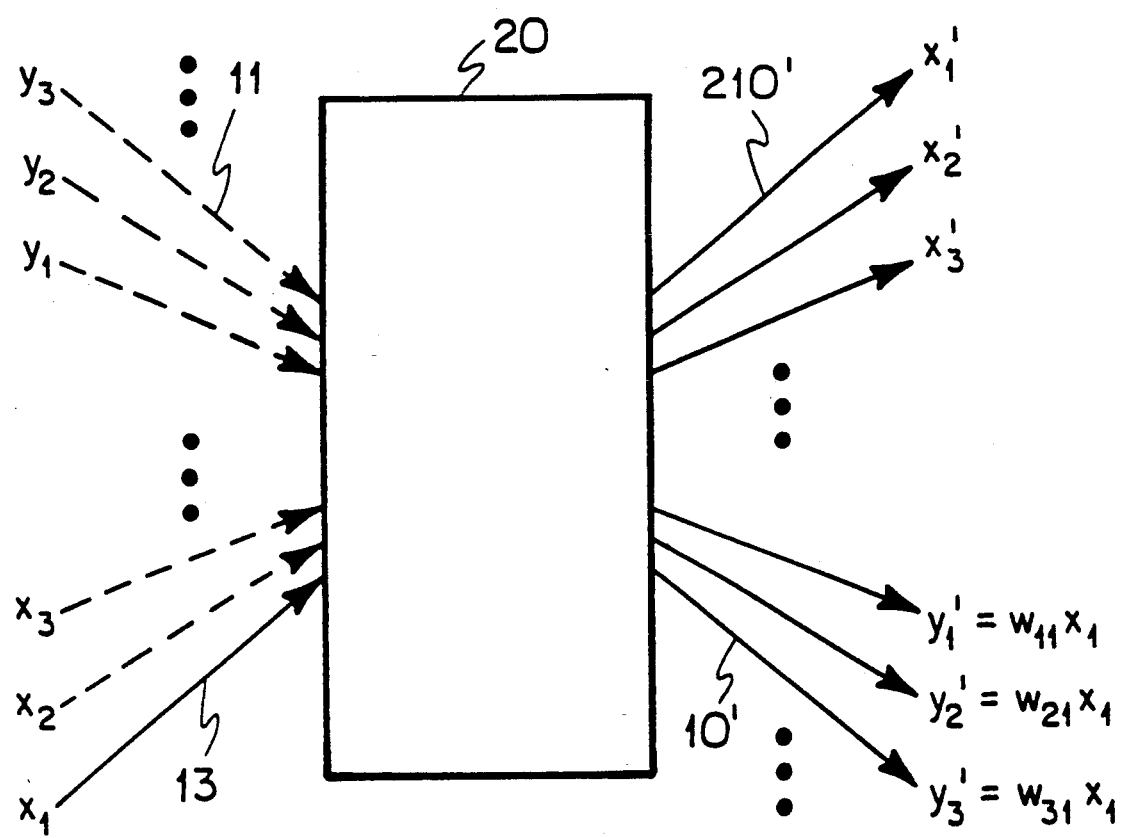
FIG. 8 is a schematic diagram of the optical interconnection paths due to a holographic interconnection architecture for the 3:3 fan-out/fan-in case, constructed such that each input and output node is only singly angularly encoded, showing the origin of crosstalk and throughput loss due to beam degeneracy.

4. Comparison of Architecture of the Invention with Previous Approaches—Simulation Results FIG. 8 schematically illustrates what would happen in the case of using the sets of object and reference beams 11, 13, respectively, in an N:N fan-out/fan-out case, of which a 3:3 fan-out/fan-in case is shown explicitly. The beams 13 comprise the three reference beams $x_1$, $x_2$, and $x_3$ (shown explicitly), among others (indicated by the set of three dots). Object beams 11 comprise $y_1$, $y_2$, and $y_3$ (shown explicitly), among others. It is desired to record a fully connected interconnection pattern, with an independent interconnection weight established between each "input" $x_j$ and each "output"

$y_i$. In FIG. 8, dashed lines indicate the presence of beams employed at some point during the recording cycle, while solid lines indicate a specific readout example in which only the beam $x_1$ is used as an input, generating the zeroth order beams $x_1'$, $x_2'$, and $x_3'$, as well as the output (reconstructed) beams $y_1'$, $y_2'$, and $y_3'$. As will be shown in FIGS. 9 and 10, such arrangement, typical of the interconnection schemes investigated in the prior art, is subject mag-nitude when each common object beam such as $y_1$, $y_2$, or $y_3$ is utilized to record either simultaneous (coherent or incoherent) or sequential (incoherent) interconnections with either a full or partial set of reference beams $x_1$, $x_2$, and $x_3$, and the readout is performed with mutually incoherent reference beams. In this case, readout with two or more reference beams creates equally many beams propagating in each ouput direction $y_i'$. Such output beam directions for any given output beam $y_i'$ are hence degenerate, and the throughput loss is in fact directly attributable to this beam degeneracy. Throughput losses will also be observed when the readout is performed with mutually coherent reference beams if the recording process was performed either simultaneously with mutually incoherent reference beams, or sequentially with independent reference beams. Furthermore, these interconnection schemes are subject to both a significant throughput loss and coherent recording crosstalk when the same sets of interconnections are recorded simultaneously with mutually coherent sets of reference and object beams (such as $y_1$ with $x_1$, $x_2$, and $x_3$).

In the discussion of phase volume holographic recording, a quantity of importance is the strength v of a given recorded holographic grating, which is defined as $$v = (2\pi/\lambda) \Delta n\, d$$

in which $\lambda$ is the wavelength utilized for holographic grating reconstruction, d is the effective thickness of the holographic recording medium, and $\Delta n$ is the amplitude of the modulated index of refraction associated with this given grating, such that the spatial dependence of the local index of refraction on the spatial coordinate x is given by:

$$n(x) = \Delta n\, \sin(2\pi x/\lambda).$$

In the case of either incoherent or coherent recording with incoherent readout of the interconnection gratings, fan-in throughput loss is observed. In this example, the weights are in the ratio of 1:2:3 ($w_{11}:w_{21}:w_{31}$). In addition, the remaining interconnection weights have been recorded such that $w_{1j}:w_{2j}:w_{3j}$ are also in the ratio 1:2:3 for j =2,3 and $w_{11} = w_{22} = w_{33}$.

Figure 9:
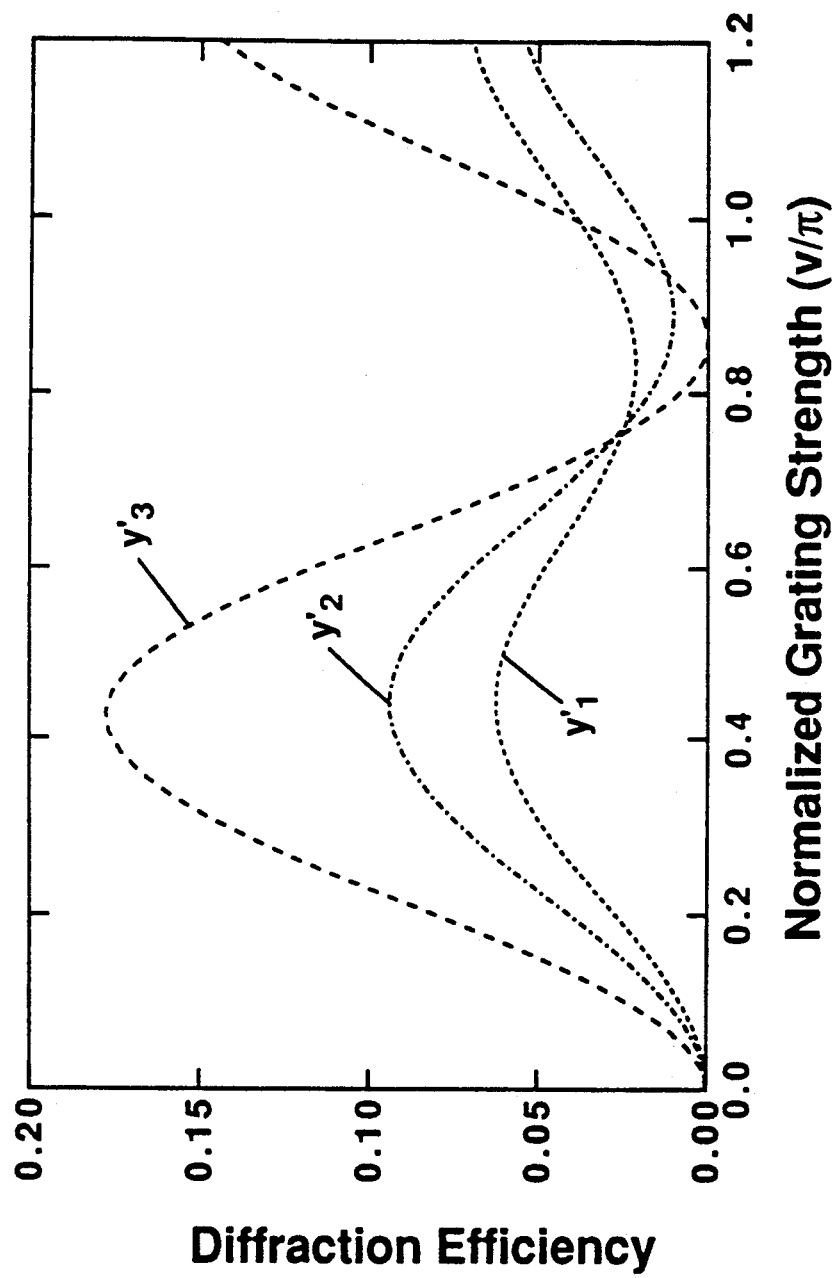
FIG. 9, on coordinates of diffraction efficiency and normalized grating strength ($v/\pi$), is a simulation result for the holographic interconnection architecture of FIG. 8 utilizing the optical beam propagation method, for the case of sequential recording of the interconnection gratings, showing the fan-out loss.

The results of simulations utilizing the optical beam propagation method are given in FIG. 9, which shows that the ratio of the fan-out (here, 1:2:3) is retained; however, the total efficiency (0.06+0.09+0.18) is considerably less than 1, due to the throughput loss from the transmitted zeroth order beams 210, (a direct result of beam degeneracy). This can be simply explained by reference to FIG. 8, from which it can be inferred that reconstruction beams 10, comprising outputs $y_1'$, $y_2'$, and $y_3'$ are automatically Bragg matched to the interconnections recorded between $x_2$ and $y_1$, $y_2$, and $y_3$ and between $x_3$ and $y_1$, $y_2$, and $y_3$. Hence, $y_1$, $y_2'$ and $y_3'$ reconstruct unwanted (in this example) zeroth order beams 210' comprising $x_2'$ and $x_3'$, which take considerable efficiency from the reconstruction of $y_1'$, $y_2'$, and $y_3'$.

Figure 10:
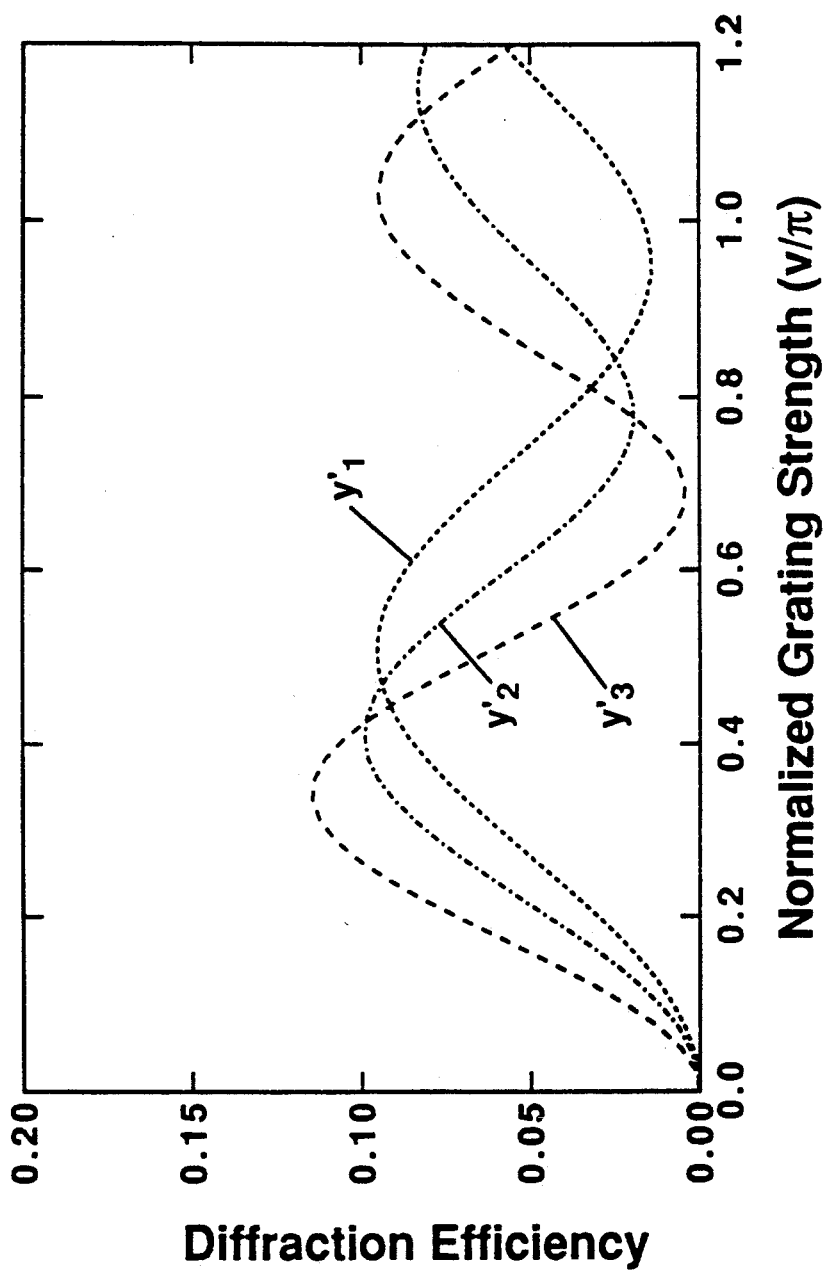
FIG. 10, on coordinates of diffraction efficiency and normalized grating strength ($v/\pi$), is a simulation result for the holographic interconnection architecture of FIG. 8 utilizing the optical beam propagation method, for the case of simultaneous fully coherent recording of the interconnection gratings, showing the fan-out throughput loss and the occurrence of recording-induced crosstalk.

In the case of coherent and simultaneous recording of the interconnection gratings, not only is fan-in throughput loss observed, but also coherent recording-induced crosstalk is seen. In FIG. 10, the total efficiency is, like in FIG. 9, considerably less than 1, due to the beam degeneracy throughput loss. Further, the correct ratio of the fan-out is lost at and near the peak diffraction efficiency, due to recording-induced crosstalk. The notion of maintaining ef-ficient interconnections in such an arrangement is thus seen to be a myth.

Figure 11:
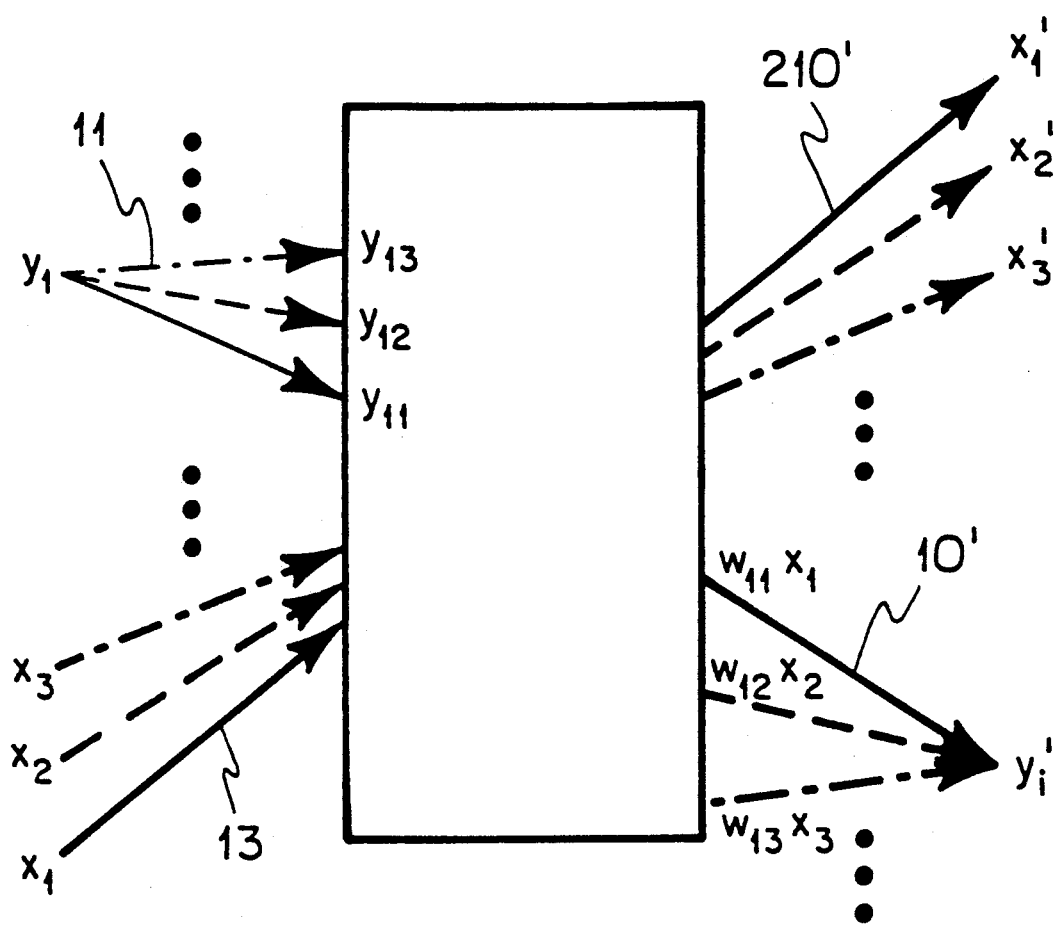
FIG. 11 is a schematic diagram of optical interconnection paths of the apparatus described in FIG. 6 for the 3:3 fan-out/fan-in case, showing the angular multiplexing of both object (source) and reference beam sets, configured to produce angular multiplexing of the reconstruction beam fan-in to a given output node.

FIG. 11 is similar to that of FIG. 8, except that it is based on employing the architecture of the invention, and shows the angular multiplexing of both the object (source) and reference beam sets 11, 13, respectively, as well as angular multiplexing of the fan-in to a given out-put node. In FIG. 11, coherent pairs of object beams 11 and reference beams 13 are depicted in like manner; since all of the reference beams are mutually incoherent due to the source array 14 (as shown for example, in FIG. 6A), each reference beam $x_j$ interferes with only one given object beam passing through the point $y_1$; therefore, none of the reconstructed beams 10' and zeroth order beams 210' are Bragg-matched to additional gratings and hence no beam degeneracy throughput loss is observed.

Coherent recording-induced crosstalk is eliminated among the reference beams, since they are all mutually incoherent. Coherent recording-induced crosstalk among the object beams is limited again by the mutual incoherence of the source-derived beams to occur only among the set of object pixels illuminated by each coherent and expanded object beam. This latter source of crosstalk is of lesser consequence in the architecture of the invention, since all of the crosstalk terms tend to cancel out because of the type of mutual coherence involved in the reconstruction.

In FIG. 11, an incoherent fan-in due to output point $y_1'$ is shown to consist of a weighted sum of inputs of the form $w_{11}x_1 + w_{12}x_2 + w_{13}x_3 = y_1'$, or, in general for an N-input, N-output fully connected interconnection network:

$$y_i' = \sum_{j=1}^{N} w_{ij}x_j \qquad (1)$$

The representation used for drawing the vector directions and scales of the input and output beams in FIG. 11 presumes an asymmetric input and output lens configuration (not shown). (Such an asymmetric input and output lens configuration is depicted in FIGS. 6A (lens 26) and 6B (lens 38)).

5. Spatial Light Modulators

Figure 12:
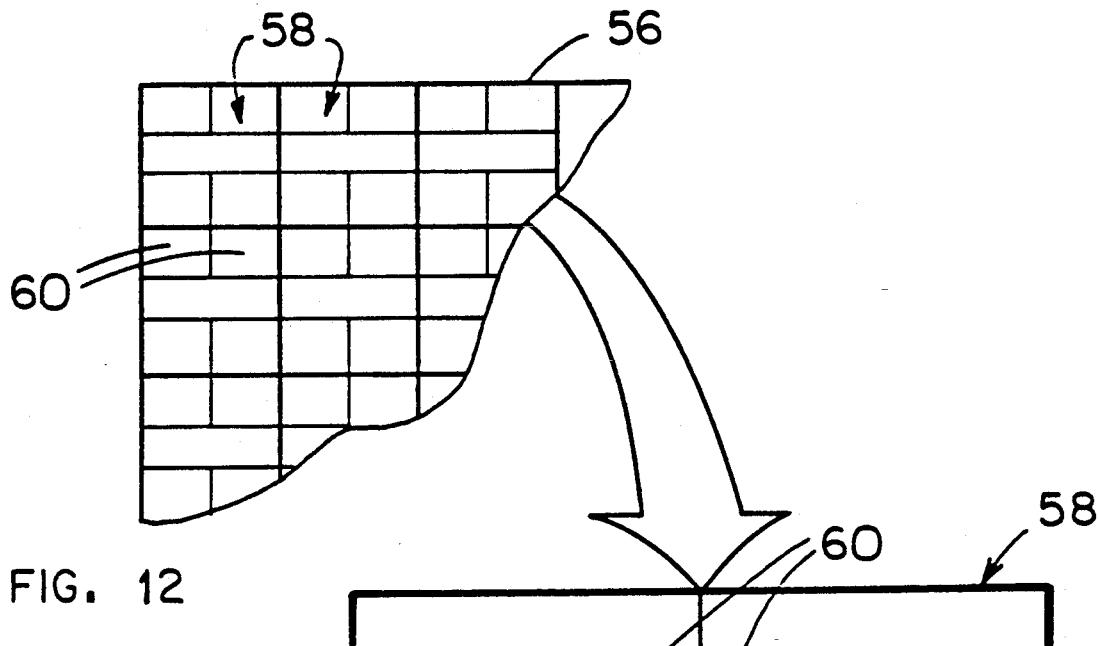
FIG. 12 is a schematic diagram of a multi-function spatial light modulator, as utilized in the interconnection architecture shown in FIG. 14, showing the incorporation of multiple photosensitive elements, control electronics, and multiple modulation elements within each pixel.
Figure 12A:
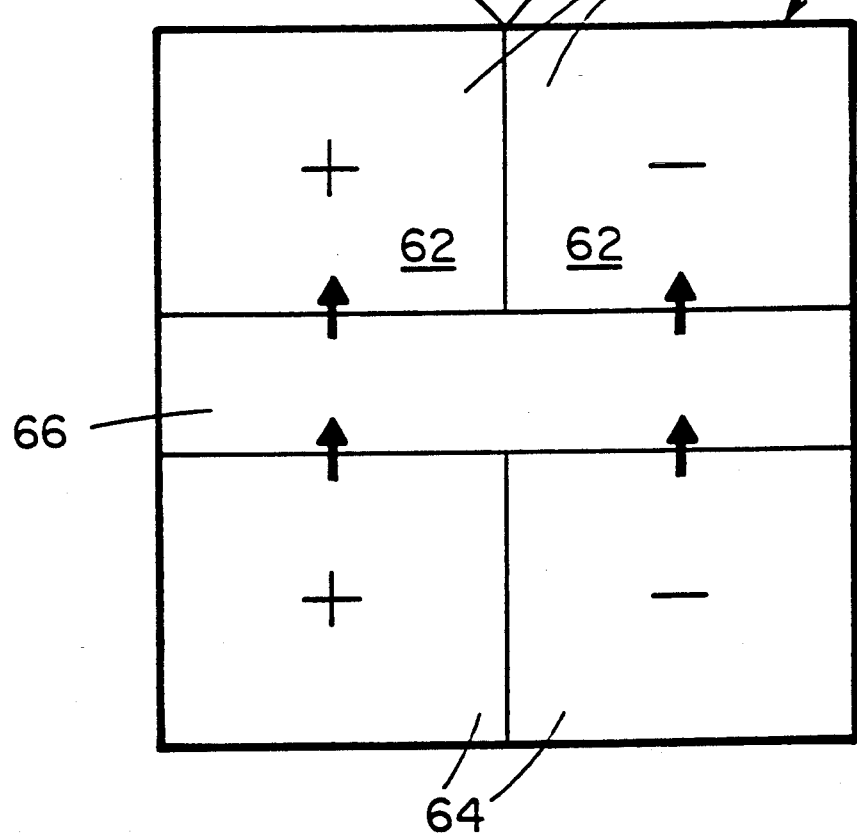
FIG. 12A is an enlargement of a potion of FIG. 12.

The detection, ampliflication, functional implementation, and modulation functions required in both the neuron unit output and input planes are envisioned to be incorporated in multifunction spatial light modulators. A dual rail differential approach may be employed as it inherently incorporates considerable functional generality, with capacity to accommodate both bipolar inputs and bipolar outputs. The simpler case of unipolar outputs and bipolar inputs, also common in neural network models, represents a subset of our fully bipolar design and requires even less chip area. The dual rail approach involves the hybrid or monolithic integration of two detectors, appropriate amplification and control circuitry, and two modulators within each SLM pixel, as shown in FIGS. 12 and 12A. A primary approach is to develop analog circuitry that is process-compatible with both detector and modulator requirements, and at the same time utilizes minimum integrated circuit real estate. Although development of second generation chips in the compound semiconductor system may utilize either multiple single-quantum-well or multiple coupled-double-quantum-well modulation and detection elements in conjunction with electronic circuit elements such as bipolar junction transistors, MESFETs, MISFETs, HEMTs or resonant tunnel diodes (RTDs), the first generation chips have been designed within the silicon repertoire (MOSIS (Metal Oxide Semiconductor Implementation Service, Information Sciences Institute, University of Southern California) design rules) in order to establish functional integrity and preliminary estimates of non-ideality and process-induced variances Furthermore, hybrid integration of silicon chips (with integrated detectors and control electronics) with compound semiconductor based or other technological implementations of the modulation function can be accomplished by bump contact bonding in conjunction with appropriate through-substrate vias. Alternatively, the vias can be eliminated by the use of transparent modulator substrates, with the modulation elements operated in the reflection mode, in conjunction with a second-bump-contact-bonded substrate hybrid-integrated with the first to provide the detection and control circuitry on the two innermost facing substrate surfaces The current chip set contains 100×100 $\mu$m pixels, within which 2500 $\mu$m$^2$ is dedicated to dual rail circuitry that implements a sigmoid-like linear transfer characteristic with both upper and lower level saturation (FIG. 13), a nonlinear function of considerable utility in the neural network application, as described in more detail in a succeeding section. The design described herein (FIG. 13A) incorporates only fifteen transistors per pixel within 2 $\mu$m minimum feature size design rules, and allows for 10$^4$ dual rail pixels/cm$^2$.

While any of a variety of SLMs may be used in the practice of the invention, a novel SLM described below is preferred. The preferred SLM is optically addressed (as opposed to electrically addressed) and is depicted in FIGS. 12 and 12A. The SLM may comprise a substrate 56 comprising a plurality of pixels 58, at least two portions of each pixel comprising regions 60 that can be controllably made transparent to incident light with varying degrees of optical density from a first source or set of first sources (such as source array 14). Means 62 are associated with each transparent region 60 to modulate the passage of light therethrough. Alternative means can be provided for modulation of the reflection of light from, rather than the passage of light through, each separate modulation element within each pixel.

Figure 12B:
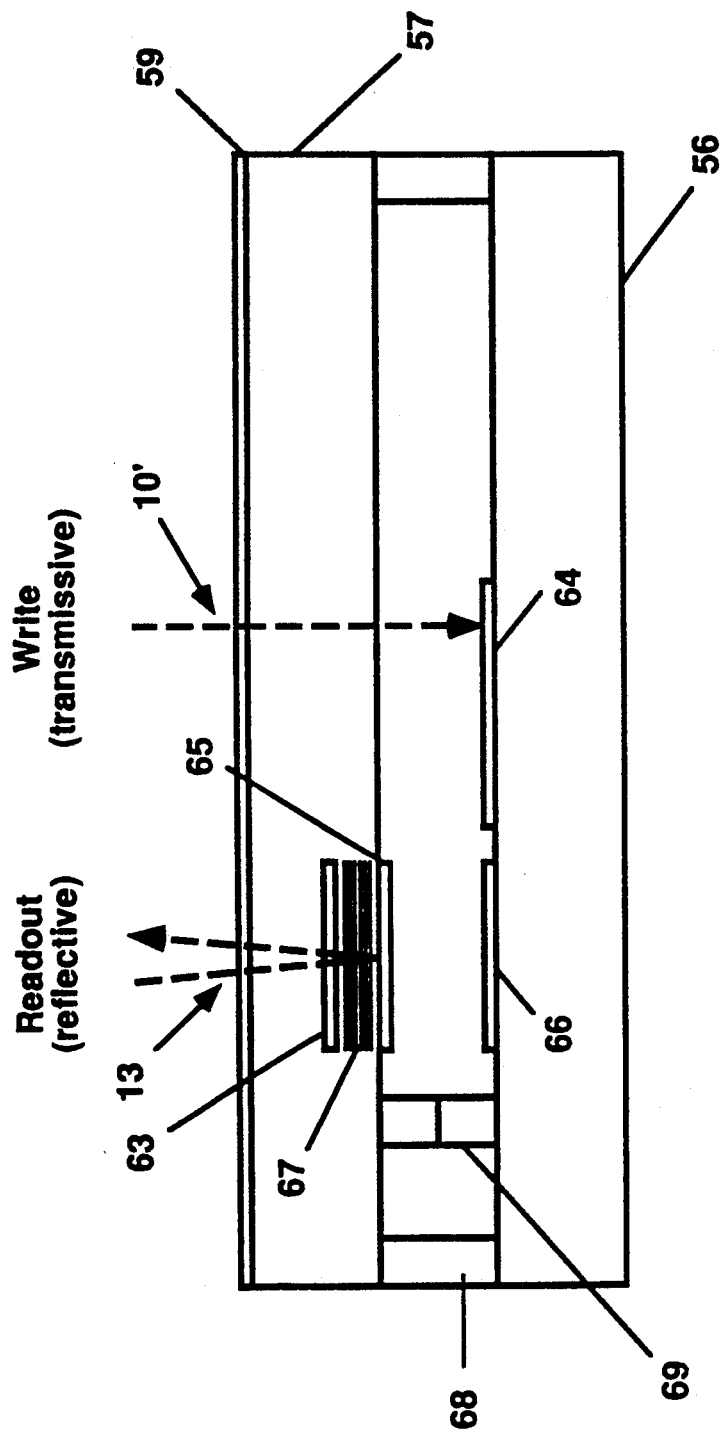
FIG. 12B is a schematic diagram of a preferred embodiment of a hybrid spatial light modulator, in which the photodetectors and control electronics are fabricated on a silicon substrate, and the multiple-quantum-well modulator elements are fabricated on a gallium arsenide (GaAs) substrate, with the two sets of devices bump-contacts on a pixel-by-pixel basis to provided parallel electrical communication.

In the preferred embodiment, such modulation elements are incorporated on a second substrate 57 as described in detail above and shown schematically in FIG. 12B, and may comprise, for example, multiple quantum well modulators comprising alternating layers of indium gallium arsenide (In$_x$Ga$_{1-x}$As) and gallium arsenide (GaAs), with a specific composition chosen such that peak modulation efficiency is achieved at the central wavelength characteristic of the optical sources that comprise the source array. Again in the preferred embodiment, such multiple quantum well structures 67 are incorporated in an asymmetric Fabry-Perot cavity comprising two mirrors 63 and 65 of unequal reflectivity, one placed on either side of the multiple quantum well layers, as is well-known to those skilled in the art. As such, the novel surface-to-surface bonding of the active elements by means of bump contacts 69 deposited on the innermost facing substrate surfaces, in conjunction with the use of a modulator substrate 56 that is transparent to the readout illumination 13, implies the use of an asymmetric Fabry-Perot cavity that is inverted relative to that normally employed by those skilled in the art, in that the low reflectivity mirror 63 is grown or deposited first, followed by the growth of the multiple quantum well layers 67, and finally followed by the growth or deposition of the high reflectivity mirror 65, as shown in FIG. 12B. An anti-reflection coating 59 deposited on the outside surface of the modulator substrate 57 is typically incorporated to increase the contrast ratio of the modulator on reflective readout, as well as to improve the sensitivity of the detector 64 to the write beam(s) 10' transmitted through the modulator substrate 56 to the surface of the substrate 56 that supports the detector 64 and control electronics 66 within each individual pixel. In one preferred embodiment, the use of a modulator substrate 57 that is transparent to the readout illumination 13, in conjunction with the use of In$_x$Ga$_{1-x}$As semiconductor laser diode sources and In$_x$Ga$_{1-x}$As multiple quantum well modulators further implies the advantageous use of intrinsic rather than doped gallium arsenide substrates in order to minimize absorption in the substrate of readout illumination 13. In certain cases, it may be advantageous to fix the separation between the two substrates by incorporating a perimeter spacer 68.

Figure 14:
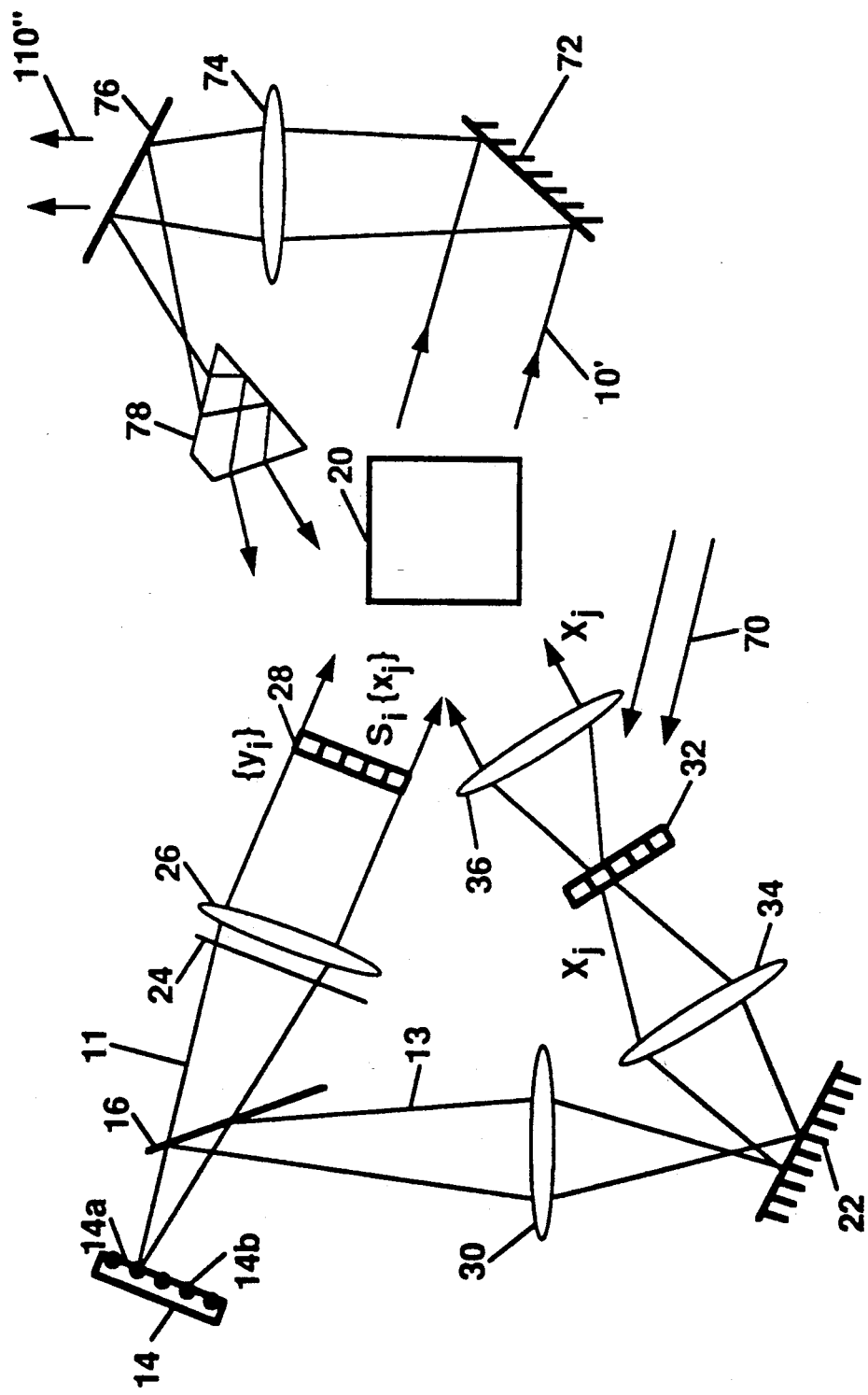
FIG. 14 is a schematic diagram of a preferred embodiment of apparatus for the implementation of neural network modules, for the case of Hebbian learning.

Detector means 64 of a type well-known to those skilled in the art (e.g., vertical p-n junction photodiodes, vertical p-i-n junction photodiodes, vertical bipolar junction phototransistors, or interdigitated p-n junction photodiodes) associated with each pixel detect incident light from a second source or set of second sources, such as from the output of the multiplexed storage hologram 20; see, e g , FIG. 14. The detector means generates an electrical signal, which is fed to electronic means 66 associated with each pixel 58. The electronic means 66 is responsive to the electrical signal from the detector and generates a modulation signal (output electrical signal) which is sent to the modulation means 62. The electronic means 66 comprises, therefore, the several functions of electrical signal transduction (following each detector), signal amplification and level shifting, transfer function implementation (establishment of the functional relationship between the input optical intensity and the output optical amplitude or intensity following the modulator element), and impedance matching to the electrically activated means of each modulation element. As a result, light transmitted through or reflected from the SLM is modulated according to an overall transfer function relationship that implements a desired algorithmic dependence, as specified further in the several following sections.

Both ⊕ (positive) and ⊖ (negative) channels are depicted in FIG. 12A. Note that both polarity channels are provided for each of the detection and modulation functions within each individual pixel. In the preferred embodiment, this allows for the incorporation of both positive valued and negative valued interconnection weights $w_{ij}$, each carried as a separate channel within each individual pixel. This arrangement may be summarized as allowing for the incorporation of both bipolar inputs and bipolar outputs within a given interconnection network.

Figure 13:
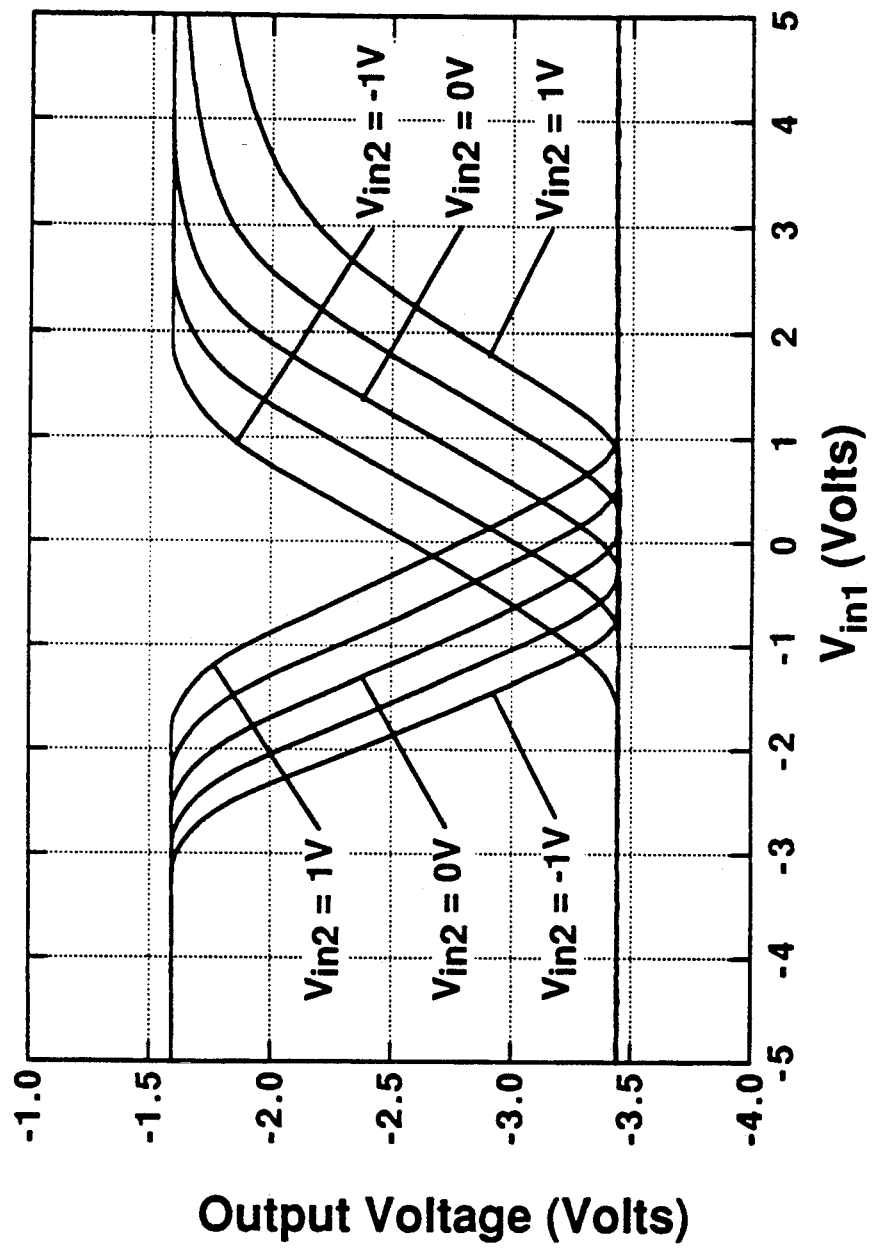
FIG. 13, on coordinates of voltage (ordinate) and voltage (abscissa), is a plot of output transfer characteristic curves for both outputs of a dual rail CMOS differential amplifier, with 15 transistors in an area of 2500 $\mu m^2$.
Figure 13A:
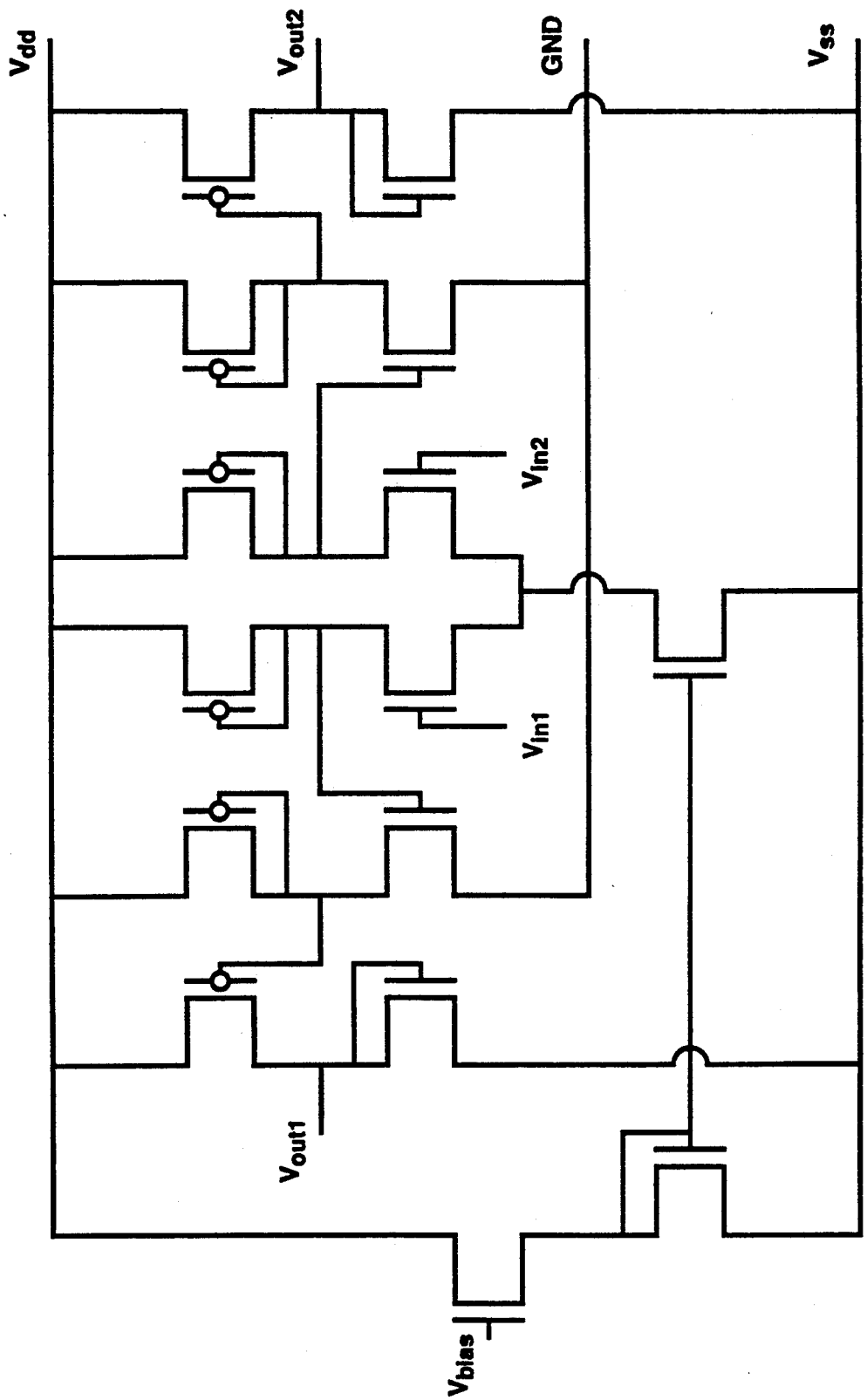
FIG. 13A is a schematic diagram of a dual rail (dual-input, dual-output) CMOS differential amplifier that effects a sigmoidal transfer characteristic, for which the experimental output transfer characteristic is shown in FIG. 13.

In the preferred embodiment, the electronic means 66 is utilized in a modified differential amplifier configuration, which is designed such that the ⊕ modulator is driven to increasing transmissivity (or reflectivity) when the ⊕ detector output exceeds the ⊖ detector output; conversely, the ⊖ modulator is driven to increasing transmissivity (or reflectivity) when the ⊖ detector exceeds the ⊕ detector output. Additionally the ⊕ modulator is not driven when the detector output difference (⊖ − ⊕) is substantially negative, and the ⊖ modulator is not driven on when the detector output differences is substantially positive, as shown in FIG. 13. The combination of these separate features results in the nonlinear sigmoid-like transfer function shown in FIG. 13.

Four additional novel spatial light modulator configurations are a part of this invention. In the first, the control circuitry is designed to implement either an astable multivibrator or ring oscillator, with either design-induced or process-variable-induced variance across the pixelated array in the center resonant frequency of the resultant oscillation, in such a manner that the individual pixels temporally modulate fully coherent light producing a mutually incoherent set of modulated beams. Such a spatial light modulator configuration is one preferred embodiment for the source array device described above. In the second, local interconnections among nearest neighbor or next-nearest-neighbor pixels are incorporated such that the control circuitry drives the modulation elements in a manner that depends not only on the one or more optical inputs to a given pixel, but also on either the one or more optical inputs to neighboring pixels, or on some functional derivative thereof as determined by control circuitry in each pixel. In the third, the modulation elements are designed in conjunction with a transparent substrate, or in the case of a hybrid integrated device with two transparent nonidentical substrates, such that the modulation creates a variable reflectivity and a variable transmissivity in each pixel, the one being the complement of the other in order to satisfy conservation of energy laws. In this case, both the array of reflected beams and the array of transmitted beams as so modulated constitute separate signals to be utilized in the implementation of system functionality. In the fourth, two superimposed optical modulation elements are incorporated in each pixel, one vertically above the other as referenced to the substrate plane, such that each is independently controllable by means of the incorporated control circuity (in turn dependent on the electrical and/or optical input state(s) of each pixel), with one of these elements exhibiting principally phase modulation in response to its input variable, while the other of these elements exhibits principally amplitude modulation in response to its independent input variable. In this manner, independent control of both the amplitude and phase modulation exhibited by each pixel is achievable; in addition, compensation can be provided for undesirable modulation-dependent phase in an amplitude modulation application, and the compensation of undesirable modulation-dependent amplitude in a phase modulation application.

6. Holographic Recording Media

A wide variety of volume holographic recording media may be employed in the practice of the invention, including static (fixed) media such as photographic film, dichromated gelatin, layered thin film media, and certain photopolymers, as well as dynamic (real time) media such as photorefractive refractory oxide single crystals (e.g., bismuth silicon oxide, bismuth germanium oxide, bismuth titanium oxide, barium titanate, potassium tantalate niobate, strontium barium niobate, potassium niobate, lithium niobate, and lithium tantalate), photorefractive compound semiconductor single crystals (e.g., chromium-doped gallium arsenide, intrinsic (undoped) gallium arsenide, cadmium telluride, and iron-doped indium phosphide), photochromic glasses, and biologically-derived photosensitive molecules dispersed in various matrices.

In each case, it is desirable for purposes of scalability in the practice of the invention that such materials be configured so as to exhibit "thick" holographic grating characteristics, as defined by the well-known holographic grating characteristics, as defined by the well-known holographic parameter Q defined by $$Q = 2\pi\lambda d/n\Lambda^2$$

in which both $\lambda$ and $d$ have been previously defined, n is the average (unmodulated) index of refraction of the holographic recording medium, and $\Lambda$ is the period of a given recorded grating Thick holographic grating performance is usually observed when the recording configurational parameters are so chosen or constructed that $Q \geq 10$. For such values of Q, the Bragg width (angular response characteristics about the Bragg angle) given by $\Theta_B = \arcsin(\lambda/2\Lambda)$ can be made narrow enough to support a large number of independent gratings capable of reconstruction without interference, overlap, or interchannel crosstalk.

B. Neural Networks

1. Technical Approach

The basic elements and functions of common neural networks are discussed above and shown in FIGS. 1–3. A neural network typically learns by changing its interconnection weights according to a learning technique, which is typically expressed as an update rule for the weights. After the network has learned, the values of the interconnection weights may not be known (and may be difficult to probe); only the correct performance of the overall neural network is verified.

A general neural network architecture should have the following features: (1) modularity, i.e., be in the form of a cascadable "module"; (2) capability for lateral, feedforward, and feedback interconnections; (3) analog weighted interconnections; (4) bipolar signals and weights; (5) scalability to large numbers of neuron units with high connectivity; and (6) generalizability to different network models and learning algorithms, as well as capability for extension to possible future network models.

Recently, there has been a substantial amount of research and development on optical and optoelectronic implementations of neural networks; to the best of the inventors, knowledge, none of the optical or optoelectronic systems described to date by others have simultaneously demonstrated all of the foregoing features. The apparatus described herein, as applied to neural networks in the given embodiments, provides for essentially all of the above features.

This architecture utilizes the novel incoherent/coherent hologram recording and reconstruction apparatus of the invention, and has angular multiplexing at each input node, configured to produce angular multiplexing of the fan-in to a given output node. This provides for simultaneous read/write capability with reduced crosstalk and enhanced optical throughput. The use of this apparatus with multiplexed volume holograms permits scalability of the neural network and its interconnections. It also provides simultaneous updates of all weights at each iteration of learning. Since some learning techniques (e.g., multilayer supervised learning) can require an extremely large number of iterations for large networks, fast weight updating is crucial. In addition, since the copying apparatus described previously above can be used directly in neural network applications, rapid copying of all recorded weighted interconnections can be readily performed. Thus, duplicates of a neural network that has learned a given processing function can be rapidly manufactured.

Optoelectronic spatial light modulators with hybrid or monolithically integrated detectors, modulators, and electronics at each pixel as described in the previous section are envisioned for the 2-D neuron unit arrays. These spatial light modulators provide for flexible functions within a single technology, thus enabling generalizability to different neural network models and learning algorithms. They also permit bipolar signals and synaptic weights to be integrated into the system architecture.

The use of photonic technology provides for high fan-in/fan-out capability via optics as well as parallel input/output for incorporation into larger heterogeneous or homogeneous systems without loss of system throughput, thus providing modularity. Unlike current optical architectures, the photonic architectures comprising preferred embodiments of the invention readily generalize to many neural network models (including single and multi-layer, feed-forward and recurrent networks) and learning algorithms (supervised and unsupervised), with applications to associative memory, combinatorial optimization, and pattern recognition, including vision and speech.

2. Interconnections.

For the purposes of the present discussion, consider the connections from a single neuron unit, including fan-out and synaptic weights, to be represented by a single hologram. During learning, all holograms are updated simultaneously in a photorefractive crystal or other suitable volume holographic recording medium. This is done by using one self-coherent beam pair for each recorded hologram, in the incoherent/coherent, angularly multiplexed fan-in apparatus and method described earlier (e.g., FIG. 6A). Referring to FIG. 6A, the set of reference beam intensities $x_j$ serves as the input signals to the neural interconnections, and the set of signals $A_j$ serves as the set of training signals during learning. The holograms are then reconstructed by the same set of reference beams, as shown in FIG. 6B. This results in the desired incoherent sum $\Sigma_j w_{ij}x_j$ at each pixel of the output array, in which $w_{ij}$ is the stored interconnection weight from neuron unit j to neuron unit i.

Experimental results on writing and reading angularly multiplexed volume holograms using this incoherent/coherent process in silver halide and photorefractive bismuth silicon oxide media show minimal crosstalk at the same time as high optical throughput.

The advantages of this technique are as follows:

(1) All weights can be updated simultaneously. This obviates the need for sequential exposures which are inefficient as well as time consuming, and at the same time maximizes parallelism.

(2) Both the object beams and the reference beams are angularly multiplexed, and each training signal pixel as well as each output node corresponds to a set of angularly multiplexed beams. This circumvents the problem of incoherent fan-in loss, maximizing optical throughput, providing incoherent pixel-by-pixel summation, and minimizing beam degeneracy crosstalk. (In addition, crosstalk due to accidental grating degeneracies is eliminated by optimization of the geometry of the beams, as well as by the spatial light modulator placement and pixelation; see, e.g., D. Psaltis et al, *Proc. SPIE*, Vol. 963, pp. 70–76 (1988).)

(3) As described above, this technique permits the capability of rapidly copying the entire collection of recorded interconnections and weights to another volume medium by using this same incoherent/coherent reconstructing and recording technique. In addition to that described above, another advantage of this technique is the capability to refresh the interconnection periodically, by copying it back and forth between two or more holographic media; additionally, two parallel networks can be implemented to separate the learning function from the processing function. The architecture described herein is unique to the best of the inventors' knowledge in allowing for this possibility.

In order to adaptively interconnect a large number ($10^4$ to $10^6$) of input elements to an equally large number of output elements with high connectivity and negligible crosstalk, the most attractive candidate technology is currently that of photorefractive volume holographic optical elements For many (if not all) proposed optical implementations of neural networks, including that described herein, demonstration of appropriate degrees of reconfigurable multiplexing capacity with negligible or at least tolerable interconnection crosstalk is essential to the achievement of successful integration. The architecture proposed herein is uniquely designed to accentuate the strengths of currently available photorefractive materials (such as $Bi_{12}SiO_{20}$ and GaAs), while minimizing the inherent weaknesses. For example, the incorporation of a fully parallel weight-update scheme with mutual incoherence between pairs of sources results in a significant reduction in the degree of source-generated crosstalk characteristic of fully coherent recording schemes, while simultaneously obviating the need for sequential recording that is particularly cumbersome and time consuming in photorefractive media.

3. Learning Techniques

A broad class of learning techniques, both supervised and unsupervised, can be represented by the single weight update equation:

$$\Delta w_{ij} = \alpha \delta_i x_j - \beta w_{ij} \tag{1}$$

in which $\Delta w_{ij} = w_{ij}(k+1) - w_{ij}(k)$ is the weight update, $x_j$ is the signal level of the $j^{th}$ input (e.g., $j^{th}$ neuron unit of the previous layer in a multilayer network), and $\delta_i$ is dependent on the particular learning technique. In Eqn. (1) above, $\alpha > 0$ is required and $\beta \geq 0$ is dictated by the physical constraints of the material. The architectures described herein implement learning of the form of Eqn. (1). Specific examples include:

$$\delta_i = y_i \text{ (Hebbian)}$$

$$\delta_i = t_i - p_i \text{ (Widrow-Hoff)}$$

$$\delta_{i,l-1} = f(p_{i,l-1})\Sigma_k \delta_{k,l} w_{ki} \quad \text{(Back propagation, all layers except output layer)}$$

$$\delta_{1,L} = (t_{i,L} - y_{i,L}) f'(p_{i,L}) \quad \text{(Back propagation, output layer; least mean square (LMS), single layer)}$$

in which $y_i$ denotes the output of neuron unit i in the current layer, $t_i$ is the target or desired value for the output of neuron unit i for supervised learning, $\delta_{i,l}$ is the error term of neuron unit i in the $l^{th}$ layer, and $f(p_{i,l})$ represents the neuron threshold function of the neuron potential $p_{i,l}$ of the $i^{th}$ neuron in the $l^{th}$ layer. The index L represents the output layer, and $\alpha$ and $\beta$ are constants. In particular, $\alpha$ is the learning gain constant and $\beta$ is the decay constant. The last term is an optional decay term that is included primarily to model intentional or unintentional decay of gratings in a photorefractive crystal. Other important physical effects include non-linearities in the response of the medium. For example, with appropriate encoding of data, the photorefractive material can yield a net response of $\Delta w_{ij} \alpha \, \text{sgn}(\delta_i x_j)(|\delta_i x_j|)^{\frac{1}{2}}$, in which sgn(u) is equal to $+1$ if $u>0$, $-1$ if $u<0$, and 0 if $u=0$. Simulations indicate that such a non-linearity can actually improve the performance of the apparatus during learning. (Most other physical ef-fects such as saturation and nonuniformities in the me-dium are considered primarily unintentional and can be treated or accounted for separately.)

Thus, the implementation problem reduces to (1) implementing the weight updates given in the generic learning technique of Eqn. (1), and (2) generating the terms $\delta$ for the appropriate learning technique. The former is the more difficult task, and once it is accomplished, many learning techniques, the above comprising only a few examples, can be implemented.

4. Neuron Units and Weight Update Calculation

Two-dimensional optoelectronic spatial light modulator (SLM) arrays, with integrated detectors, modulators and electronics, as shown in FIGS. 12, 12A, and 12B, are envisioned for conventional inner product neuron units, as well as for generation of the $\delta_i$ terms. This technology provides: (1) incorporation of bipolar signals via two-channel inputs and outputs; (2) slight variants of the same basic SLM structure for all SLMs in the architecture (for neuron units and $\delta_i$ generation); (3) incorporation of different neuron unit functions, including linear, soft threshold, and hardclipping, as well as variable gain; and (4) potential extendability to future neural net models.

5. Architecture.

The architecture for the case of Hebbian learning, $\delta_i = y_i$, where $y_i$ is the output of neuron unit i, is shown in FIG. 14. (Generalization to other learning techniques is given below.) Only feedforward connections are shown.

The two sets of recording beams 11 and 13 and the components therein are the same as described in FIG. 6A. Modulator 32 ($x_j$) serves as the inputs to the interconnections; the write input 70 of modulator 32 ($x_j$) is the input to the neural network; alternatively, this input can be derived from the previous layer or module. The output (reconstructed) hologram beams 10' reflect off mirror 72, and are imaged via lens 74 onto the write side of spatial light modulator 28, after reflecting from beamsplitter 76. Lens 74 in effect images the output of SLM 28 (virtual image), through recording medium 20, and onto the input of SLM 28. The combination of detector(s), control electronics, and modulator(s) that comprise SLM 28 is used to form the array of neuron outputs $y_i$, which are functionally dependent (e.g., by means of a threshold or sigmoid response) on the incoherent weighted sums of the form $\Sigma \, w_{ij} x_j$ summed over j.

Dove prism 78 serves to flip the beam so that the image orientation at SLM 28 is consistent. Then, the readout beam passing through SLM 28 has pointwise intensity proportional to $y_i$, the output of the neuron units as determined by the weighted interconnections in the layer or module depicted in FIG. 14. Output beam 110" is directed to a subsequent module or layer, or can be used to generate outputs of the neural network. Lateral and feedback interconnections are implemented by adding an optical path similar to the output path 10', in this case by incorporating a beamsplitter behind medium 20, and reflecting a portion of the set of output beams 10' around the bottom of FIG. 14, to be imaged onto the input side of SLM 32. This provides lateral and feedback connections within medium 20. If fixed connections are desired (as is often the case for lateral connections), while maintaining adaptive feedforward connections, then instead a path is inserted from behind lens 36 (via a beamsplitter), through a separate hologram, and is imaged onto the input side of SLM 32. The same optical arrangement is also used when adaptive lateral and/or feedback connections that update by a different training technique than the feedforward connections are desired.

During the computation phase, the shutter 24 is closed to prevent learning. The array of sources is imaged onto SLM 32 as a set of read beams. Each beam is modulated by SLM 32 to provide the inputs Then each (reference) beam $x_j$ passes through the hologram 20 to provide the interconnections, i.e., the weighted fan-cut from each input $x_j$. The hologram output is sent to the write side of SLM 28 via the lens 74, at which point the pointwise incoherent sums are detected, functionally transformed, and used as inputs to the modulator(s) within each individual pixel.

In the learning phase, the shutter 24 is open. The weight update term is computed optically (by the spatial modulation of beam 11 by SLM 28 and by the pairwise interference of the object and reference beams) and recorded into the photorefractive material 20. Light from each source is approximately collimated and used as the read beam for SLM 28. Thus, for an N by N array of sources, there are $N^2$ beams reading SLM 28 simultaneously, each at a different angle; all $y_i$ terms are encoded onto each of these beams Each of these beams interferes only with its corresponding reference beam, $x_j$, from the same source, in the photorefractive material 20. This writes the set of desired weight update terms $\alpha x_j y_i$.

Figure 15:
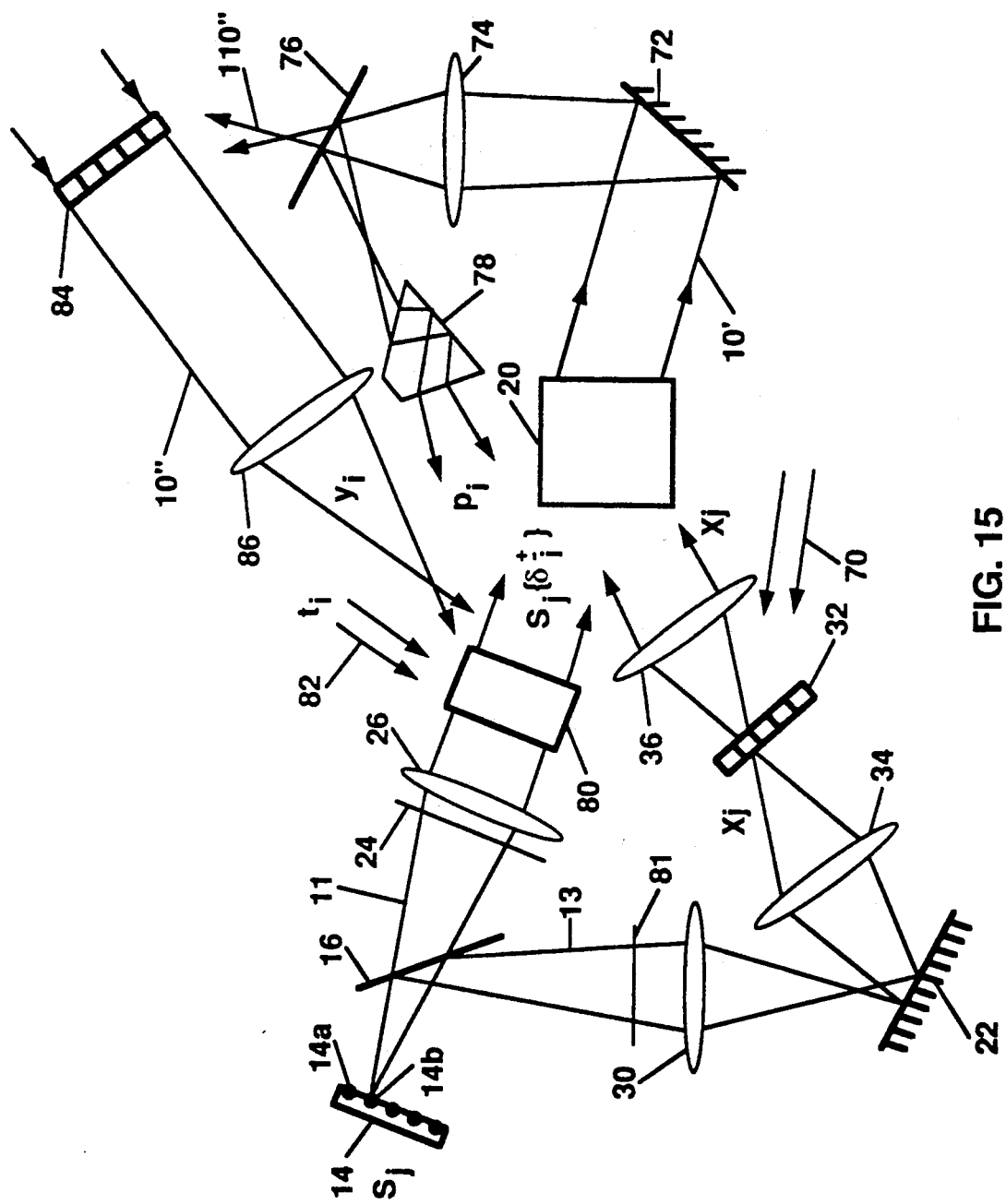
FIG. 15 is a schematic diagram of a preferred embodiment of apparatus for the implementation of neural network modules, for learning algorithms of the form $\Delta w_{ij} = \alpha x_i \delta_j$.

A generalized architecture is shown in FIG. 15. The paths and components for recording the holograms are the same as above, except for the training term generator 80 and an additional shutter 81. The purpose of generator 80 is to optically generate the $\delta_i$ terms according to the learning technique being implemented. In general, there are as many as three different input signals to generator 80 (usually at most two of them are needed for a given learning technique). The input $t_i$ on beam 82 is a target or desired output signal for supervised learning, $y_i$ are out-puts (and $p_i$ are the corresponding potentials) of neuron units at the output of the current module. Beams 110″ write onto spatial light modulator 84 (in an image plane of the exit plane of generator 80); the SLM is then read out by beam 10″, through lens 86 which images SLM 84 onto the appropriate SLM in the generator.

Figure 16B:
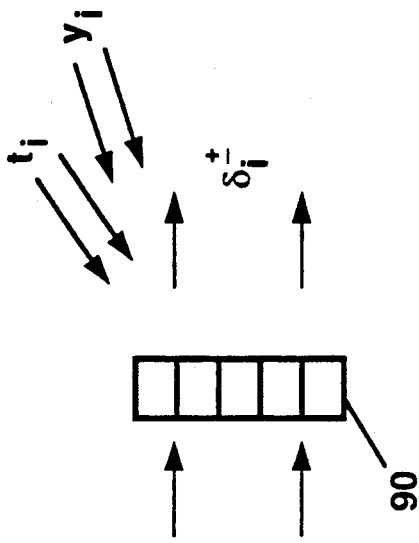
FIGS. 16A-C are schematic diagrams of preferred embodiments of means for generating learning terms $\delta_i$, for the cases of (A) Widrow-Hoff, (B) Perceptron, and (C) back propagation learning.
Figure 16C:
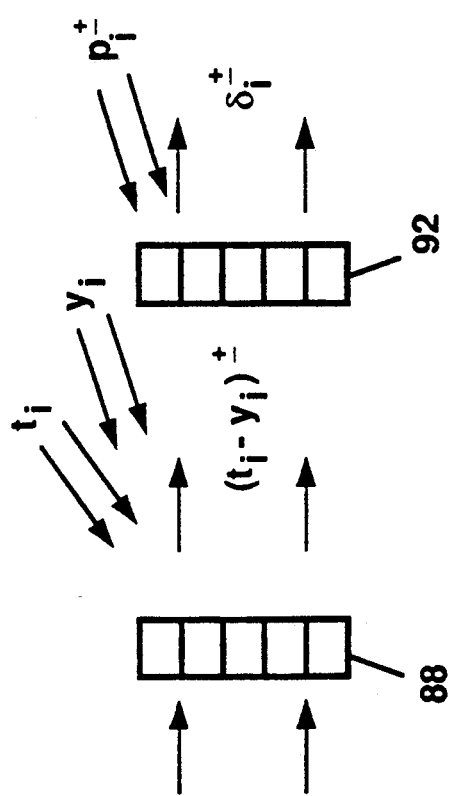
Figure 16A:
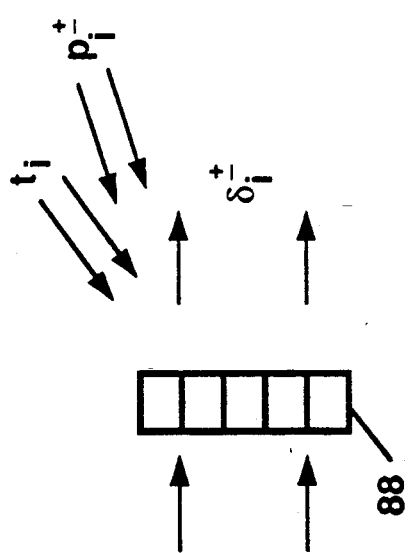

Means for implementing sample learning techniques (for generator 80) are shown in FIG. 16. These implement the well-known (A) Widrow-Hoff, (B) Perceptron, and (C) least mean square (LMS) learning techniques. All spatial light modulators have differential (positive and negative channel) inputs and dual channel outputs (both positive and negative). They all have nearly the same circuitry. Spatial light modulator 88 provides a linear difference of the inputs; spatial light modulator 90 has a higher gain with saturation to provide a binary response; spatial light modulator 92 provides a non-monotonic function (e.g., Gaussian) for the $f'(p_i)$ term. Spatial light modulator 32 in other Figures is the same as SLM 88, except for a soft thresholding characteristic provided by the control circuitry and output drivers in SLM 32. For the case of back propagation (LMS) in a hidden layer, the pair of signals $y_i$ and $t_i$ input to each pixel in (C) is replaced by the error term $\Sigma k\ \delta_{k,l} w_{ki}$ from the previous layer. Each layer generates such error terms in the following manner. Beam path 11 passes through the hologram 20 and reconstructs an additional output beam. This additional output beam contains the information $\Sigma k\ \delta_{k,l-1} w_{ki}$ and is sent to modulator 88 of the previous layer. It should also be noted that an alternative arrangement can implement multilayer neural networks in a single module of FIG. 15, by directing the output signals 110″ to the input of SLM 32, using optical feedback to en-able multiple passes through different neuron units and through the same holographic medium 20.

Figure 17:
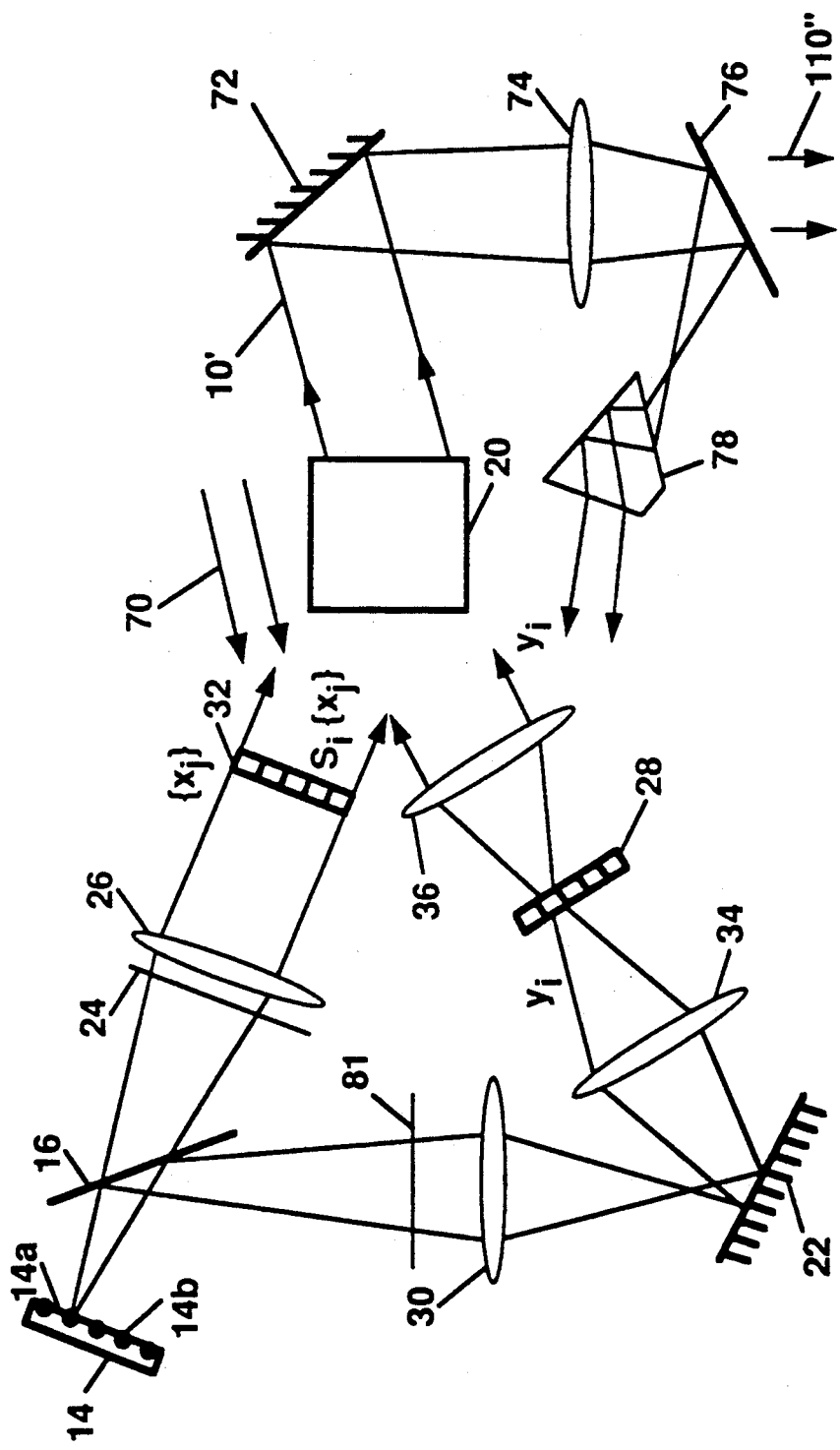
FIG. 17 is a schematic diagram of an alternative embodiment of apparatus for the implementation of neural network modules.

A variant of this architecture can be obtained by exchanging the spatial light modulators 28 and 32, as shown schematically in FIG. 17. (SLM 28 is again replaced by SLM 80 for the general case.) In this case, the upper SLM 32 in FIG. 17 represents the layer inputs $x_j$, while the lower SLM 28 represents $y_i$. The optical feedback is imaged onto the lower SLM 28. This provides for coherent fan-in at each neuron unit input. With intensity coding of data, this coherent sum deviates from neural models, but in some cases may provide an increase in diffraction efficiency to each neuron unit.

In the preferred embodiment, the object SLM 28 performs spatial (parallel) modulation of the object beams, while SLM 32 performs independent modulation of each reference beam. In the variant described above, SLM 32 performs spatial (parallel) modulation of each reference beam, while SLM 28 performs independent modulation of each object beam. In two additional configurations, both SLMs may perform spatial modulation, or both SLMs may perform independent modulation. Specific applications will dictate the particular choice of modulation.

C. TELECOMMUNICATIONS

Photonic switching networks may be divided into two categories: telecommunications switching and interconnection networks for digital computing. The primary difference between these two categories is in the distance scale and the data bandwidth per channel required by the application; as a result, telecommunications data channels are typically carried on optical fibers and have many multiplexed data channels on each fiber, with wavelength division multiplexing being a common multiplexing technique. Interconnection networks for digital computing (1) may have data channels on optical fibers or on free-space optical beams, (2) can be much higher bandwidth per channel, and (3) usually do not multiplex more than a few channels on one optical signal line. Local area networks are in between these two realms, and are not discussed here, as once the two more extreme cases are illustrated, the middle ground is a straightforward extension.

In this section, embodiments of the invention are described for the application of telecommunication switching networks. It is assumed that the input and output optical signals are wavelength division multiplexed, although the embodiments are applicable to a broad range of channel multiplexing schemes. The embodiments described are directly applicable to circuit switching networks. In this case, it is important to distinguish between the control signals that are used to set the routes and state of the switch, and the (high bandwidth) data signals that are routed through the switch from an input or source node to an output or destination node. In addition, one physical input data transmission line (i.e., one optical fiber) is referred to herein as a data line, and each individual information channel as a data channel. Thus, many data channels, each at a different optical wavelength, are multiplexed onto one data line. An array of data lines is input to and output from the optical switch.

Photonic switching networks should have the following properties: (1) high bandwidth for the data signals, (2) compatible physical interface(s) to the optical input and output lines, (3) compatibility with multiplexing schemes utilized for the input and output lines (usually by demultiplexing the input signals and re-multiplexing the output signals), (4) capability for implementing a large number of input and output lines in a relatively compact package, (5) packet and/or circuit switched control, (6) reconfigurability at a low-to-moderate rate (for circuit switched networks) or at a high rate (for packet switched networks), and (7) ability to re-route some data signals while other data channels are being used. In addition, it is desirable to have the capability for broadcast (fan-out) of a data channel in some applications, as well as fan-out and fan-in of a physical data line.

Figure 18:
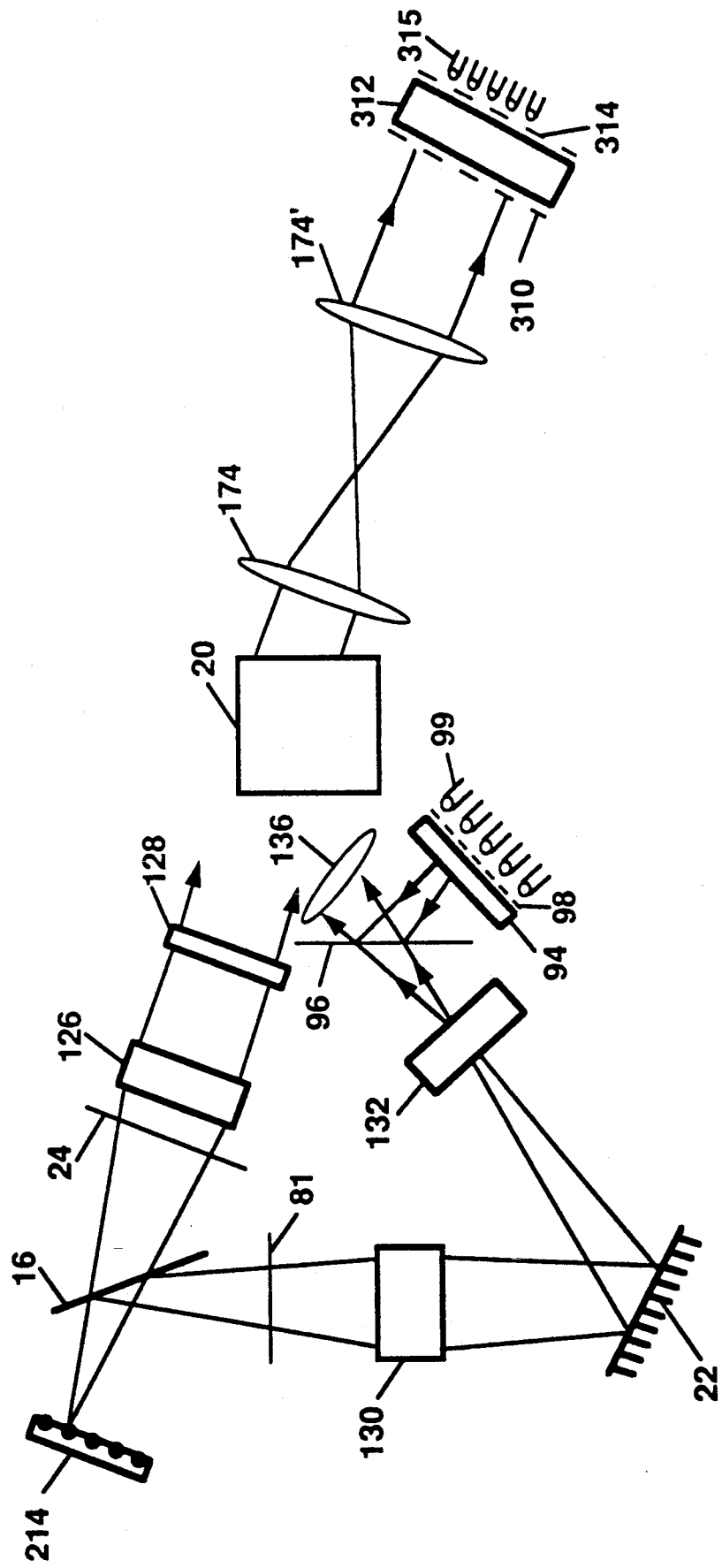
FIG. 18 is a schematic diagram of apparatus for switching from a set of wavelength division multiplexed optical input lines to a set of wavelength division multiplexed optical output lines, wherein the source array and two spatial light modulators are used to control the routing of the switch.

The first described embodiment will accommodate a 1-D array of wavelength division multiplexed (WDM) inputs and a 1-D array of WDM outputs. The apparatus is shown in FIG. 18. A source array means is provided at 214; this consists center optical frequency $v_j$ along one dimension (e.g., row), with each individual source along the other dimension (e.g., column), all at essentially the same center frequency, but arranged so as to be mutually incoherent, as in previously discussed embodiments. Each center frequency $v_j$ corresponds to the center frequency of one optical data channel. Two means for providing this array are described below.

This source array provides illumination for the control signals. The set of optical beams from 214 are split by beamsplitter 16. The reference beams are reflected from 16, pass though shutter 81, through optics 130 and are additionally reflected from reflecting means 22. The optics 130 are anamorphic and serve to condense the dimension of different center frequencies $v_j$ to a single pixel at 132, while imaging the dimension of mutually incoherent sources centered at $v_j$ from 214 to source control 132. At 132, means are provided for modulating each pixel independently, and for making the phase fronts leaving 132 substantially identical to the phase fronts leaving wavelength demultiplexer 94. If the modulator in 132 has a high enough contrast ratio and turns off sufficiently well, then shutter 81 is not needed. The beams leaving 132 are made to pass through beamsplitter 96 and optics 136 that very approximately collimates the beams. In the case of focal lengths and distances being appropriately chosen, optical means 136 can be omitted. The beams are then incident on volume holographic recording medium 20. The source array as modified and passed through control element 132 provides the set of reference beam illumination signals for the holographic recording process. The other set of beams from source array 214 passes through beamsplitter 16, shutter 24, optics 126, and destination control 128 which consists of a spatial light modulator that serves to input the routing function. The beams are then incident on the holographic recording medium 20. Optics 126 are anamorphic and serve to image the beam in the dimension of the different optical center frequencies $v_j$ from the source array 214 to the modulator 128. In the dimension of mutually incoherent sources centered at $v_j$, optics 126 serves to direct the beam from each source through all corresponding pixels of 128 in the corresponding 1-D dimension (e.g., column). This completes the control signal portion of the apparatus.

A set of switch states can be loaded into the hologram by any of three techniques: (1) sequencing through the one-dimensional array of pixels 132 one at a time, interfering each with appropriate destination control signals from 128 (thus recording control signals for all wavelengths of a given input line in one step); (2) sequencing through a set of updates given by the interference of many pixels in 132 with pixels in 128, similar to the neural network case described above; or (3) a compromise between these two extreme cases. A potential advantage of (2) is a decrease in the number of sequences required in certain cases.

The data signals input to the switch and arranged in plane 98 (e.g., from optical fibers 99), are sent through an optical wavelength demultiplexer 94 (e.g., a grating), reflect off beamsplitter 96 and follow a substantially identical path from 96 to the holographic recording medium 20. The exit plane of 94 is in a conjugate (image) plane of the exit plane of 132. When the two sets of control beams from 214 are blocked (via shutters or modulator means in 132 and 128), only the data signals pass through the holographic medium. After diffracting from the recorded interference patterns in medium 20, the output data signal beam passes through optics 174, 174' to plane 310, which is an image plane of the modulator 128. Then, fiber interface unit 312, which consists of optics and an optical wavelength multiplexer, multiplexes all wavelengths along the optical center frequency $v_j$ dimension, in order to yield the one dimensional wavelength division multiplexed output at data output plane 314. An optical fiber array 315, for example, can be arranged following 314 to receive the rerouted and remultiplexed data signals from the data inputs arranged at 98; these routing and multiplexing functions can include channel broadcast, line broadcast, and line fan-in functions.

Once established, the routes through the switch can be changed all at once by erasing the holographic recording material and then re-recording the new interconnection pattern. Individual routes can selectively be changed by either of two techniques: (1) not refreshing the old routes to be changed, which will then decay in time, and refreshing the new routes; or (2) erasing specific gratings using binary phase modulation in 128 and 132; such phase modulation to selectively erase gratings has been previously demonstrated; see, e.g., A. Marrakchi, *Optics Letters*, Vol. 14, No. 6, pp. 326–328 (15 Mar. 1989).

Two alternative means for providing the source array 214 are described herein. In FIG. 19A, a two-dimensional array of sources 316 is shown, in which the center optical frequency is varied along dimension 318, and the mutual incoherence of the sources with essentially the same center frequency is provided along dimension 320. This can be accomplished, for example, by providing an array that is designed to implement the wavelength variation in one dimension of the array, with typical processing-induced stochastic variation providing the required mutual incoherence in the second dimension. This array can then be used directly in plane 214.

Figure 19B:
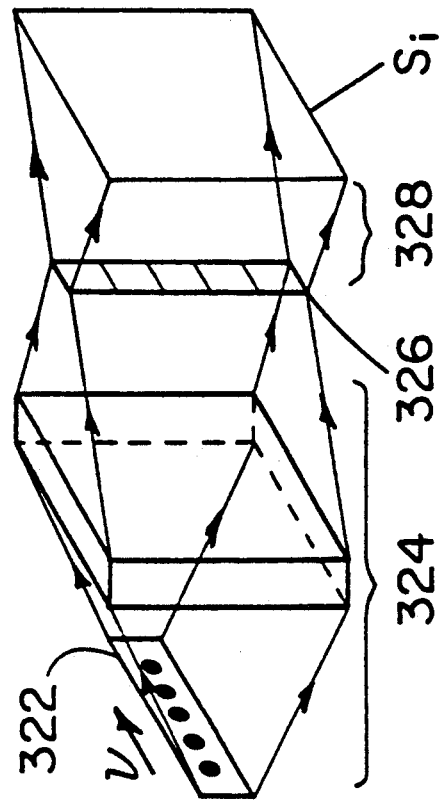
FIG. 19B is a schematic diagram of an alternative embodiment utilizing a one-dimensional source array, with center frequency of each element being different, and a one-dimensional phase modulator array providing mutual incoherence.
Figure 19A:
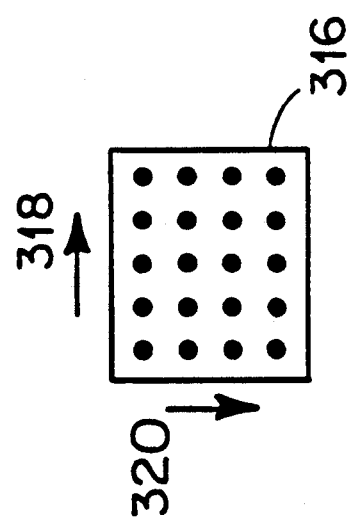

Another means for providing the source array distribution 214 is shown in FIG. 19B. In this case, two one-dimensional arrays are used. Element 322 is a one dimensional array of sources, e.g. laser diodes, each with a different optical center frequency $v_j$, and can be fabricated as a one-dimensional version of source array 316. Optics 324 expands the beams in the dimension perpendicular to 322, and condenses in the dimension of source array 322 before passing through one-dimensional phase modulator 326. Each pixel of modulator 326 provides phase modulation at a different frequency, and can be fabricated as a one-dimensional version of the pixelated piezoelectric mirror or pure phase modulator array described previously in Section A2. Optics 328 then expands the result in the orthogonal dimension, thereby producing a two-dimensional array, which can then be used as the input source array 214. The optics 324 and 328 in FIG. 19B are essentially the same as those of an analog optical outer product matrix processor (R. A. Athale, Proceedings Tenth International Optical Computing Conference, IEEE Catalog No. 83CH1880-4 pp. 24–31, Apr. 1983). It will be noted that in this case, the beamsplitter 16 can be inserted before the plane $S_i$ (but after 326); this will make the overall system more compact.

Referring now to the case of two-dimensional WDM data input lines and two-dimensional WDM data output lines, the apparatus is again shown in FIG. 18, but the following components have different functions than those described for the case of one-dimensional data signals. The source array 214 is a two dimensional array, each element of which has a different frequency modulation imposed on it in order to produce mutual incoherence among all the source elements; each element of the source array 214 contains beams of all center frequencies $v_j$, which corresponds to the center frequencies of each data signal channel. Means for providing this are described below. In the case of applications that do not require data channels to fanin and do not require output data channels to be angularly multiplexed, the mutual incoherence is not required; only means for amplitude modulating individual elements are required. Optics 130 now image from 214 to the modulator plane in 132. The source control 132 consists of both an optical wavelength demultiplexer and a two-dimensional modulator. Optics 136 again very approximately collimates the beams. Optics 126 directs the light from each pixel of 214 through every pixel of the modulator in 128. The destination control now includes an optical demultiplexer (e.g., grating). The data inputs at plane 98 are now arranged in a two-dimensional array, as are the data outputs at plane 314. The optics of 312 is now simpler than that required for the previously discussed embodiment, as all of the reconstructed pixels are imaged by 20 and 174, 174' onto the correct locations for output at plane 310.

Figure 20:
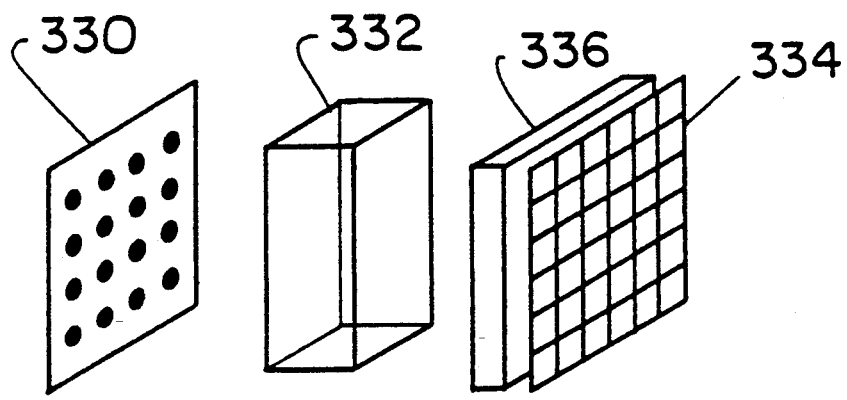
FIG. 20 is a schematic diagram of means for providing the source array of FIG. 18 in the case of a 2-D WDM input line array and a 2-D WDM output line array, showing a 2-D laser diode array each element of which has a different center frequency, and a modulator array.

Means for providing the source array signals are shown in FIG. 20. A two dimensional source array (e.g., surface emitting laser diodes) 330 provides an array of sources, each at a different center frequency $v_j$. The optics 332 directs the light from each source element to all pixels of the two-dimensional modulator array 334. Each pixel of modulator array 334 provides phase modulation at a different frequency, and can be fabricated as the pixelated piezoelectric mirror or pure phase modulator array described in Section A2. Modulator array 334 then provides the optical signals of plane 214 as depicted in FIG. 18. As discussed above, in the common case of applications that do not require data channels to fan-in and do not require output data channels to be angularly multiplexed, the mutual incoherence is not required. In this case, modulator array 334 provides the requisite amplitude modulation. Furthermore, in most such applications, binary amplitude modulation is sufficient. If optics 332 is provided by simple (non-multiplexed) elements, such as a simple beam expander (e.g., lens), then an optical wavelength multiplexer 336 (e.g., set of gratings) is incorporated as shown. Its function is to fan in the beams of different center frequencies to be collinear at each pixel.

Finally, it should be noted that by more precisely collimating the beams at the recording medium 20 and by choosing center frequencies $v_j$ appropriately, the apparatus described above can be extended to a two-color system in which the data signals read out the stored holographic interconnections non-destructively. In this case, the geometry and scaling of the optical data paths are changed relative to those of the optical control signal paths.

D. Digital Computing

For the application of digital computing interconnections, it is assumed that the inputs and outputs are not wavelength division multiplexed, such WDM cases having previously been discussed above. Further, they can be input to, and output from, the interconnection network in the form of optical fibers or as free space beams that are imaged from one plane to another. In the case of optical fibers, a photonic system for a crossbar interconnection network can be explained using FIG. 18, in which the following components are interpreted differently than in the telecommunications application previously described. The data inputs and outputs are arranged in 2-D arrays. The source array 214 is a 2-D array of individually coherent but mutually incoherent sources, as described above. Here they all have the same center wavelength. The remaining components in FIG. 18 are the same as in the telecommunications switching apparatus, for the case of 2-D data input and output arrays, with the exceptions detailed herein. Since the input and output data are not wavelength multiplexed, the wavelength multiplexers and demultiplexers in 94, 128, and 312 are not needed. The output fiber interface unit 312 comprises only the optical element(s) needed to couple the light into each fiber.

The control procedure for recording the interconnections is the same as in the telecommunications embodiment above, except that there is no wavelength dimension. Control can again be accomplished by making a recording for each single pixel of the SLM in 132, interfering with light from all destination control pixels of SLM 128. Alternatively, all pixels of both SLMs can be used during each recording cycle, in effect summing over a set of matrices of rank one to build up an interconnection pattern, similar to the neural case.

An extension of this apparatus utilizing the copying technique described herein enables faster computing. Two volume holographic recording media are employed. The primary holographic medium is used for the actual computation, and a secondary holographic medium is used to record the set of interconnection patterns from the control inputs. When the recording of a set of new interconnection patterns into the secondary medium is completed, it is copied into the primary medium in a single step. In this way, computation is being performed while the next set of interconnections is being configured. While recording of a new interconnection configuration can take some time, the copying can take place in one step. This minimizes the net reconfiguration time of the switch.

The same apparatus can be used for free space data inputs and outputs, by removing interface unit 312. Note that this is in effect a generalized crossbar, in that it not only allows arbitrary 1-to-1 interconnection, but also enables fan-out and fan-in. In addition, a two-wavelength system can be employed, as in the two-color telecommunication application, by changing the scaling and geometry of the optical data paths relative to the optical control signal paths. This enables non-destructive read-out.

E. Holographic Optical Elements

Holographic optical elements (HOEs) are elements that are used in optical systems and may include such elements as multi-focal length lenses, specific combinations of wavelength dispersive and wavefront-modifying optical elements, and for purposes here, also holographic elements for display. Examples include, but are not limited to, head-up displays (HUDs), dichroic beamsplitters, aberration-corrected lenses, multi-function beamsplitters, multiple focal length lenses, and space-variant optical elements.

Advantages of HOEs over conventional optical elements include reduced size, weight, and cost; additionally, in some cases, there are no practical alternatives to certain HOEs. Furthermore, if the HOE can be rapidly copied, then a large savings in production cost can be achieved.

A volume hologram can store a large amount of information; the process of recording all of the needed information into the volume can be a significant bottleneck in both initial development and production. In the present application, two realms are discussed: (1) that of recording complex fringe patterns in the holographic recording medium that correspond to combinations of optical elements, so that the phase fronts can be generated relatively easily and recorded relatively quickly; and (2) a computer aided approach in which a series of exposures is cycled through in order to build up the requisite interference fringe pattern in the holographic recording medium.

In the latter case, the input patterns used for each exposure are generally calculated by computer or neural network. However, if the input patterns are known a priori, and a suitable input device is available, no computations of the fringe pattern need be made. An example of this is a multiplexed holographic display in which each hologram to be displayed consists of a page of information.

Figure 21:
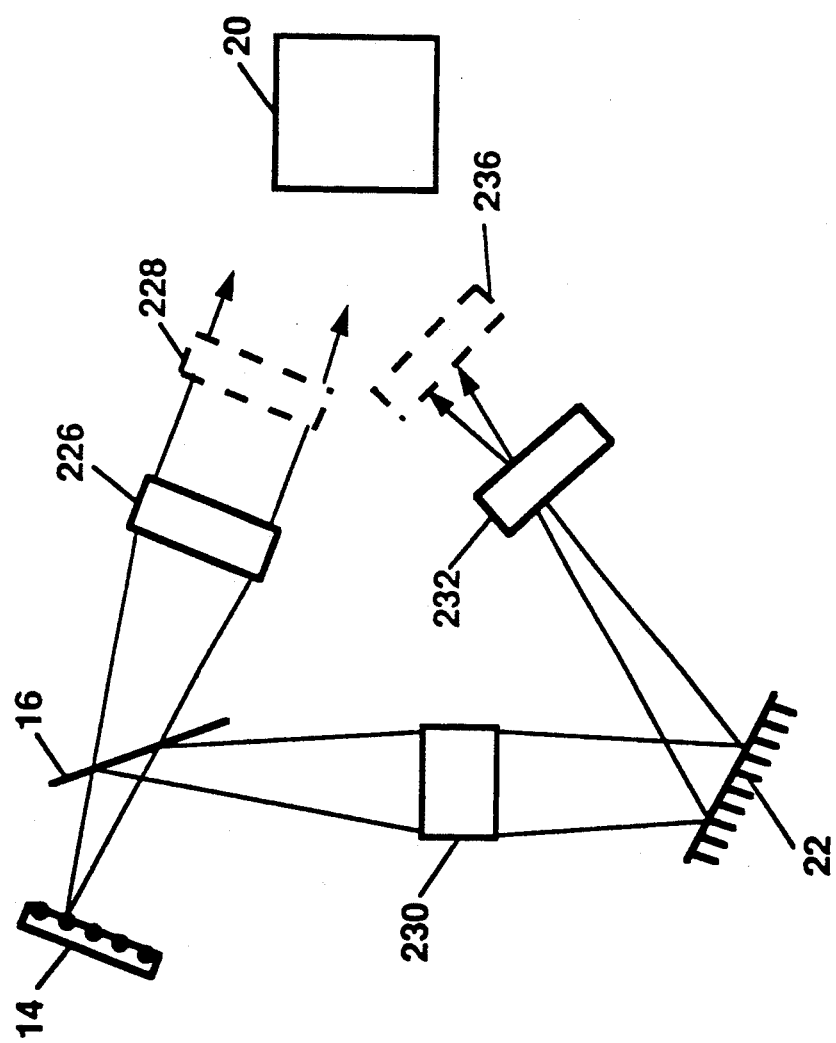
FIG. 21 is a schematic diagram of method and apparatus for recording of multiplexed volume holographic optical elements, with one set of beams modulated independently and the other set of beams modulated spatially but identically.

An example of the former case is depicted in FIG. 21. Two types of HOEs are discussed herein that can be generated from this apparatus. First, consider a HOE that functions as a space-variant lens, focusing incident plane waves at different distances z, the distance depending on the incident angle of the plane wave. The array of sources 14 generates a set of coherent but mutually incoherent beams, which are split into two paths. The upper path carries the reference beams in this case; they are transmitted by beamsplitter 16 and pass through optics 226 to the hologram 20. The spatial light modulator 228 is not needed for the exposure of this particular HOE. Optics 226 essentially collimates each beam. For response to other than collimated beams, optical means 226 can be changed to provide the appropriate focal power. The lower path functions to carry the set of object beams.

After reflecting from beamsplitter 16, optics 230 approximately images the source array 14 onto each pixel of modulator 232. In this case, modulator 232 is a static or dynamic planar microlens array. This array provides a different and programmable focal power for each source beam. Optics 236 is used to convert the spherically expanding waves to spherically contracting waves, and to provide relay optics when needed.

Upon reconstruction, plane waves incident on the holographic medium at the angles of the upper beam paths utilized during recording are converted to spherically contracting waves of different focal lengths, thus providing a highly multiplexed lens with space-variant focal length.

Figure 22:
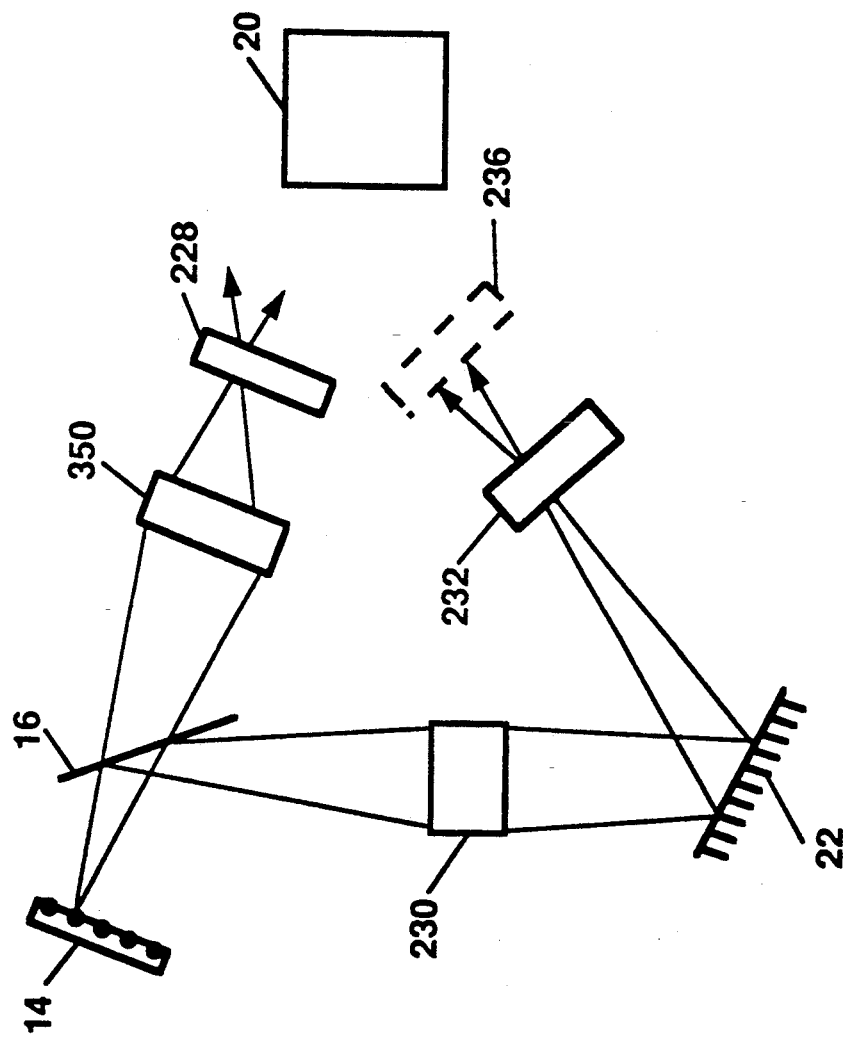
FIG. 22 is a schematic diagram of method and apparatus for recording of multiplexed volume holographic optical elements, with both sets of beams (reference and object) modulated independently.

In order to generate a space-variant lens capable of converting spherically expanding waves to spherically contracting waves, the apparatus of FIG. 22 can be used. It is the same as the apparatus of FIG. 21, except that in this case, the upper path passes through optics 350, which approximately images the source array onto the modulator 228. Means are provided by modulator 228 to modulate each imaged element of the source array in focal power (e.g., by means of a dynamic microlens array) to produce the desired space variant focal length HOE. Certain other applications require element 228 to modulate phase, or amplitude and phase, instead of focal power.

Another mode of recording permits a larger aperture of holographic recording medium 20 to be utilized for each point-spread function response of a space-variant HOE; it uses the apparatus of FIG. 21. This mode can be utilized to record essentially arbitrary phase fronts that have values at each pixel between 0 and $2\pi$. An example of such an optical element is a multiplexed HOE that stores Fresnel lenses of several different focal lengths; note that this can include spherical Fresnel lenses as well as anamorphic Fresnel-type lenses, and other even less symmetric phase fronts. In this mode, the upper path carries the object beams and the lower path carries the reference beams.

The modulator 228 is a spatial light modulator that modulates phase at each pixel; modulator 232 is an amplitude spatial light modulator and is used to set the diffraction efficiencies of each recorded hologram. Optics means 236 is configured to produce a set of multiplexed reference beams that are substantially identical to the anticipated collection of reference beams to be utilized during reconstruction. During exposure, in one embodiment the sources in 14 are turned on one at a time, and the desired object pattern is written onto modulator 228 for each source. If the same pattern at modulator 228 is to be used for multiple sources (i.e., multiple holograms), then those sources pertaining to a common object pattern can be turned on simultaneously, reducing the requisite number of recording steps. Depending on the application, this can result in considerable or even dramatic savings in recording time. In the fully sequential case, the described apparatus utilizing the two-dimensional source array still has the advantage of permitting recording of the entire multiplexed HOE without any moving parts. For reconstruction, the HOE is illuminated with reference beams substantially identical to those used during exposure, except that they may be independently and arbitrarily amplitude modulated The output beams then give the desired phase front patterns according to the object patterns that were recorded This provides a space-variant HOE in which the point-spread function response can be chosen essentially independently for each pixel of an input array. For applications requiring space-invariance over small local regions of the input plane, the same object pattern can be recorded for reference beams corresponding to neighboring pixels in the input array, or alternatively, the hologram thickness is chosen appropriately and fewer recording beams are used, yielding space-invariance within the Bragg angle of a particular hologram According to the teachings of the invention, it will be appreciated that several additional methods of multiplexing can be utilized to advantage during the recording of holographic optical elements, including angular, spatial, and/or wavelength multiplexing of both the object and reference beams.

It will also be noted that for certain appropriate applications, the upper path of the apparatus may be interpreted as carrying the reference beams, and the lower path may be interpreted as carrying the object beams. Then, during reconstruction, when beams of appropriate phase fronts are incident on the holographic medium, the output beams reconstruct spots in an image plane of optical means 232. Each reconstructed spot then has a value proportional to the similarity of the incident wavefront to one of a set of stored basis function wavefronts. (These basis function wavefronts are dependent on the input patterns during recording and the angle of each such reference beam during recording.)

Finally, consider the case of a sequence of exposures, in which the desired object patterns are not input directly, but rather are designed such that the resultant recorded holographic fringe pattern, at the termination of the exposure sequence, produces upon reconstruction the desired output functions. In this case, it is in general desirable to modulate both the phase and amplitude of the incident beams, which can be implemented with a spatial light modulator characterized by independent control over both amplitude and phase in each individual pixel, as described above; however, it should be noted that a large class of patterns can be recorded with either phase modulation only, or with amplitude modulation only. In this operational mode, the designed set of object patterns can be produced either by computer aided design techniques (for cases in which the desired holographic recording pattern is either known or can be computed with reasonable resources), or by a neural-like learning rule in which a sequence of weight updates are produced in response to a set of training patterns. In the latter case, supervised learning algorithms are exploited when desired output patterns can be represented, and unsupervised learning algorithms are exploited otherwise. The neural technique permits the HOE to converge to an approximate version of the desired HOE, without knowledge of the stored fringe pattern within the holographic medium.

INDUSTRIAL APPLICABILITY

The present invention is expected to find use in neural networks, telecommunications, digital computers, optical signal processors, and holographic optical elements.

What is claimed is:

1. An optically addressed spatial light modulator comprising a plurality of pixels on at least two substrates, at least a first substrate and a second substrate, each said pixel comprising:
   (a) modulator means to modulate, in at least one of transmission and reflection, at least one of phase and amplitude of incident light from at least one readout source, said modulator means situated on one surface of said first substrate;
   (b) detector means to detect light from at least one write source, said detector means situated on at least one of said surface of said first substrate and one surface of said second substrate, and said detector means generating an input electrical signal; and
   (c) electronic means comprising nonlinear analog integrated electronic signal processing circuitry, said electronic means situated on at least one of said surface of said first substrate and said surface of said second substrate, such that said second substrate has situated on it at least one of part of said detector means and part of said electronic means, with said electronic means implementing a prespecified input/output function, thereby generating an output electrical signal in response to said input electrical signal, said output electrical signal being suitable for driving said modulator means;

and at least a substantial subset of pixels further comprising:
   (d) connecting means for electrically connecting and physically bonding said first substrate to said second substrate, said surface to said surface, said connecting means providing parallel electrical communication between the two said substrates, thereby enabling said modulator means to be controlled by said prespecified input/output function of said input electrical signal;

and at least one of said first substrate and said second substrate being substantially optically transparent to said light from at least one of said write sources and said read sources.

2. The spatial light modulator or claim 1, wherein said first substrate comprises an intrinsic gallium arsenide substrate, and said second substrate comprises a silicon substrate.

3. The spatial light modulator of claim 1 wherein said connecting means comprises bump contact bonds.

4. The spatial light modulator of claim 1 wherein said modulator means comprises at least one of a multiple quantum well modulator, a coupled double quantum well modulator, a strained layer superlattice, and an asymmetric Fabry-Perot cavity.

5. The spatial light modulator of claim 4 wherein said asymmetric Fabry-Perot cavity is arranged in an inverted geometry.

6. The spatial light modulator of claim 4 wherein said modulator means further comprises an $In_xGa_{1-x}As$/GaAs multiple quantum well material.

7. The spatial light modulator of claim 1 wherein:
   (a) said detector means comprises at least two physically-separate individual detector means, each said individual detector generating an individual input electrical signal; and
   (b) said electronic means is responsive to both said individual input electrical signals.

8. The spatial light modulator of claim 1 wherein:
   (a) said modulator means comprises at least two physically-separate individual modulator means; and
   (b) said electronic means generates at least two interrelated individual output electrical signals, each said individual output electrical signal capable of driving at least one said individual modulator means.

9. The spatial light modulator of claim 1 wherein:
   (a) said modulator means comprises a first individual modulator means located on a first region of said surface of said first substrate, and a second individual modulator means located on a second region of said surface of said first substrate;
   (b) said detector means comprises a first individual detector means generating a first individual electrical input signal, and a second individual detector means generating a second individual input electrical signal; and
   (c) said electronic means is responsive to both said individual electrical input signals, and generates a first electrical modulator drive signal and a second electrical modulator drive signal, each said electrical modulator drive signal being interrelated to the other said electrical modulator drive signal and being capable of driving at least one said individual modulator means.

10. The spatial light modulator of claim 9 wherein said first electrical modulator drive signal is a first substantially monotonically nondecreasing function of a difference between said first individual electrical signal and said second individual electrical signal, said second electrical modulator drive signal is a second substantially monotonically nondecreasing function of a difference between said second individual electrical signal and said first individual electrical signal, both said substantially monotonically nondecreasing functions being sigmoid-like functions that saturate for large and small values of their arguments.

11. The spatial light modulator of claim 1 wherein electrical connection means are provided between each said pixel and at least one of a set of neighboring pixels that are located in a physically local region surrounding said pixel.

12. The spatial light modulator of claim 1 wherein:

(a) said modulator means comprises two layers, a first layer of which comprises an amplitude modulator means that principally modulates the amplitude but not the phase of said at least one readout source, and a second layer of which comprises a phase modulator means that principally modulates the phase but not the amplitude of said at least one readout source; and (b) said electronic means generates an electrical amplitude-modulator drive signal that controls said amplitude modulator means, and an electrical phase-modulator drive signal that controls said phase modulator means.

13. The spatial light modulator of claim 12 wherein said electronic means implement said pre-specified input/output function, generating an output electrical signal suitable for driving said phase modulation means, thereby compensating for the residual signal-dependent phase modulation imposed by said amplitude modulator means, in order to provide minimal total signal-dependent phase modulation.

14. The spatial light modulator of claim 12 wherein said electronic means implement said pre-specified input/output function, generating an output electrical signal suitable for driving said amplitude modulation means, thereby compensating for the residual signal-dependent amplitude modulation imposed by said phase modulator means, in order to provide minimal total signal-dependent amplitude modulation.

15. The spatial light modulator of claim 12 wherein said phase modulator means provides a binary phase modulation, the states of which are related by a phase shift of $\pi$ radians.

16. The spatial light modulator of claim 12 wherein said phase modulator means and said amplitude modulator means together modulate in reflection said incident light from said at least one readout source.

17. The spatial light modulator of claim 12 wherein said phase modulator means and said amplitude modulator means together modulate in transmission said incident light from said at least one readout source.

18. The spatial light modulator of claim 1 wherein said modulator means modulates in both transmission and reflection said amplitude of said incident light from said at least one readout source, thereby generating at least one reflected beam and at least one transmitted beam, such that the amplitude of said at least one transmitted beam and the amplitude of said at least one reflected beam are pairwise complementary.

19. The spatial light modulator of claim 1 wherein said pre-specified input/output function includes a sigmoid-like function, which is a substantially monotonically nondecreasing function that saturates for large and small input values.

20. The spatial light modulator of claim 1 wherein said pre-specified input/output function includes at least one of an approximate sigmoid derivative and an approximate Gaussian.

21. An optically addressed spatial light modulator comprising a plurality of pixels on at least one substrate, each said pixel comprising:

(a) modulator means comprising an amplitude modulator means that principally modulates the amplitude but not the phase of incident light from at least one readout source, said amplitude modulator means being located in a first layer, and a phase modulator means that principally modulates the phase but not the amplitude of said incident light from said at least one readout source, said phase modulator means being located in a second layer; and (b) detector means to detect light from at least one write source, said detector means generating an input electrical signal; and (c) electronic means comprising integrated electronic circuitry, said electronic means implementing a pre-specified input/output function, thereby generating an electrical amplitude-modulator drive signal that controls said amplitude modulator means, and an electrical phase-modulator drive signal that controls said phase modulator means.

22. The spatial light modulator of claim 21 wherein said electronic means implement said pre-specified input/output function, generating an output electrical signal suitable for driving said phase modulation means, thereby compensating for the residual signal-dependent phase modulation imposed by said amplitude modulator means, in order to provide minimal total signal-dependent phase modulation.

23. The spatial light modulator of claim 21 wherein said electronic means implement said pre-specified input/output function, generating an output electrical signal suitable for driving said amplitude modulation means, thereby compensating for the residual signal-dependent amplitude modulation imposed by said phase modulator means, in order to provide minimal total signal-dependent amplitude modulation.

24. The spatial light modulator of claim 21 wherein said phase modulator means provides a binary phase modulation, the states of which are related by a phase shift of $\pi$ radians.

25. The spatial light modulator of claim 21 wherein said phase modulator means and said amplitude modulator means together modulate in reflection said incident light from said at least one readout source.

26. The spatial light modulator of claim 21 wherein said phase modulator means and said amplitude modulator means together modulate in transmission said incident light from said at least one readout source.

27. A spatial light modulator comprising a plurality of pixels on at least two substrates, at least a first substrate and a second substrate, each said pixel comprising:

(a) phase modulator means to modulate, in at least one of transmission and reflection, the phase of incident light from at least one coherent readout source, said phase modulator means situated on one surface of said first substrate;

(b) electronic means comprising an integrated electronic circuit, said electronic means situated on at least one of said surface of said first substrate and said surface of said second substrate, such that said second substrate has situated on it at least part of said electronic means, said electronic means capable of driving each said phase modulator means into oscillation, said oscillation having a center frequency;

said plurality of pixels further comprising:

(c) means for setting said center frequency of said oscillation of each of at least a portion of said phase modulator means in said plurality of pixels to a distinct value, thereby providing mutual incoherence among a set of resultant beams modulated by said portion of said phase modulator means;

and at least a substantial subset of pixels further comprising:

(d) connecting means for electrically connecting and physically bonding said first substrate to said second substrate, said surface to said surface, said connecting means providing parallel electrical communication between the two said substrates, thereby enabling said phase modulator means to be controlled by said integrated electronic circuit within each said pixel in said substantial subset of pixels;

and at least one of said first substrate and said second substrate being substantially optically transparent to said light from said at least one readout source.

28. The spatial light modulator of claim 27 wherein said first substrate comprises an intrinsic gallium arsenide substrate, and said second substrate comprises a silicon substrate.

29. The spatial light modulator of claim 27 wherein said connecting means comprises bump contact bonds.

30. The spatial light modulator of claim 27 wherein said modulator means comprises at least one of a multiple quantum well modulator, a coupled double quantum well modulator, a strained layer superlattice, and an asymmetric Fabry-Perot cavity, supported on at least one of a III-V-based compound semiconductor substrate and a II-VI-based compound semiconductor substrate.

31. The spatial light modulator of claim 30 wherein said asymmetric Fabry-Perot cavity is arranged in an inverted geometry.

32. The spatial light modulator of claim 30 wherein said modulator means further comprises an $In_xGa_{1-x}As/GaAs$ multiple quantum well material.

33. The spatial light modulator of claim 27 wherein each said integrated electronic circuit for driving each said phase modulator means is either an astable multivibrator or a ring oscillator.

34. The spatial light modulator of claim 27 wherein said means for setting said center frequency of said oscillation of each of at least a portion of said phase modulator means in said plurality of pixels is derived from an intentionally incorporated space-variant non-uniformity that is design-dependent.

35. The spatial light modulator of claim 27 wherein said means for setting said center frequency of said oscillation of each of at least a portion of said phase modulator means in said plurality of pixels is derived from an intentionally incorporated space-variant non-uniformity that is process-variable-dependent.

36. The spatial light modulator of claim 27 wherein each said pixel further comprises detector means to detect light from at least one write source providing one or more optical inputs, said detector means situated on at least one of said surface of said first substrate and said surface of said second substrate, and said detector means generating an input electrical signal; and such that said second substrate has situated on it at least one of part of said detector means and part of said electronic means, with said electronic means implementing a pre-specified input/output function, thereby generating an output electrical signal in response to said input electrical signal, said output electrical signal being suitable for driving said modulator means; and wherein said means for setting said center frequency of said oscillation of each of at least a portion of said phase modulator means in said plurality of pixels is derived from an intentionally incorporated space-variant non-uniformity that is provide and controlled by at least one of said optical inputs to said detector means and said electronic means.

* * * * *